US012581929B2

(12) United States Patent
Seidemann et al.

(10) Patent No.: US 12,581,929 B2
(45) Date of Patent: Mar. 17, 2026

(54) SEMICONDUCTOR DEVICES AND METHODS FOR FORMING A SEMICONDUCTOR DEVICE

(71) Applicant: Intel Corporation, Santa Clara, CA (US)

(72) Inventors: Georg Seidemann, Landshut (DE); Martin Ostermayr, Woerth (DE); Walther Lutz, Erding (DE); Joachim Assenmacher, Unterhaching (DE)

(73) Assignee: Intel Corporation, Santa Clara, CA (US)

( * ) Notice: Subject to any disclaimer, the term of this patent is extended or adjusted under 35 U.S.C. 154(b) by 983 days.

(21) Appl. No.: 17/448,714

(22) Filed: Sep. 24, 2021

(65) Prior Publication Data

US 2023/0095162 A1 Mar. 30, 2023

(51) Int. Cl.
*H01L 23/48* (2006.01)
*H01L 23/00* (2006.01)
(Continued)

(52) U.S. Cl.
CPC ........ *H01L 23/481* (2013.01); *H01L 23/3128* (2013.01); *H01L 23/49579* (2013.01); *H01L 23/49816* (2013.01); *H01L 23/49833* (2013.01); *H01L 23/49866* (2013.01); *H01L 24/05* (2013.01); *H01L 24/08* (2013.01); *H01L 24/16* (2013.01); *H01L 24/48* (2013.01); *H01L 25/0655* (2013.01); *H01L 2224/05647* (2013.01); *H01L 2224/08225* (2013.01); *H01L*

*2224/08245* (2013.01); *H01L 2224/16225* (2013.01); *H01L 2224/48225* (2013.01);
(Continued)

(58) Field of Classification Search
CPC ............... H01L 23/481; H01L 23/3128; H01L 23/49579; H01L 23/49816; H01L 23/49833; H01L 23/49866; H01L 24/05; H01L 24/08; H01L 24/16
See application file for complete search history.

(56) References Cited

U.S. PATENT DOCUMENTS 9,654,004 B1 * 5/2017 Deligianni .............. H01L 25/50
10,756,202 B2 8/2020 Roberts et al.
(Continued)

*Primary Examiner* — Trang Q Tran
(74) *Attorney, Agent, or Firm* — SPL Patent Attorneys PartG mbB; Yong Beom Hwang

(57) ABSTRACT

A semiconductor device is provided. The semiconductor device comprises a semiconductor die comprising a semiconductor substrate and a plurality of transistors arranged at a front side of the semiconductor substrate. Further, the semiconductor die comprises a first electrically conductive structure extending from the front side of the semiconductor substrate to a backside of the semiconductor substrate and a second electrically conductive structure extending from the front side of the semiconductor substrate to the backside of the semiconductor substrate. The semiconductor device further comprises an interposer directly attached to the backside of the semiconductor substrate. The interposer comprises a first trace electrically connected to the first electrically conductive structure of the semiconductor die. Further the interposer comprises the first trace or a second trace electrically connected to the second electrically conductive structure of the semiconductor die.

22 Claims, 30 Drawing Sheets

(51) Int. Cl.

| | | |
|---|---|---|
| *H01L 23/31* | (2006.01) |
| *H01L 23/495* | (2006.01) |
| *H01L 23/498* | (2006.01) |
| *H01L 25/065* | (2023.01) |

(52) U.S. Cl.

CPC .............. *H01L 2224/48245* (2013.01); *H01L 2224/80001* (2013.01)

(56) References Cited

U.S. PATENT DOCUMENTS

| | | | |
|---|---|---|---|
| 2005/0051887 A1 | 3/2005 | Siniaguine | |
| 2008/0197491 A1 | 8/2008 | Matsui | |
| 2008/0237856 A1* | 10/2008 | Hisada | .................... H01L 24/32 |
| | | | 257/E21.511 |
| 2016/0141264 A1* | 5/2016 | Nah | .................... B23K 1/0016 |
| | | | 219/616 |
| 2017/0287872 A1 | 10/2017 | Shen | |
| 2020/0118605 A1 | 4/2020 | Hollis | |

* cited by examiner

State of the art

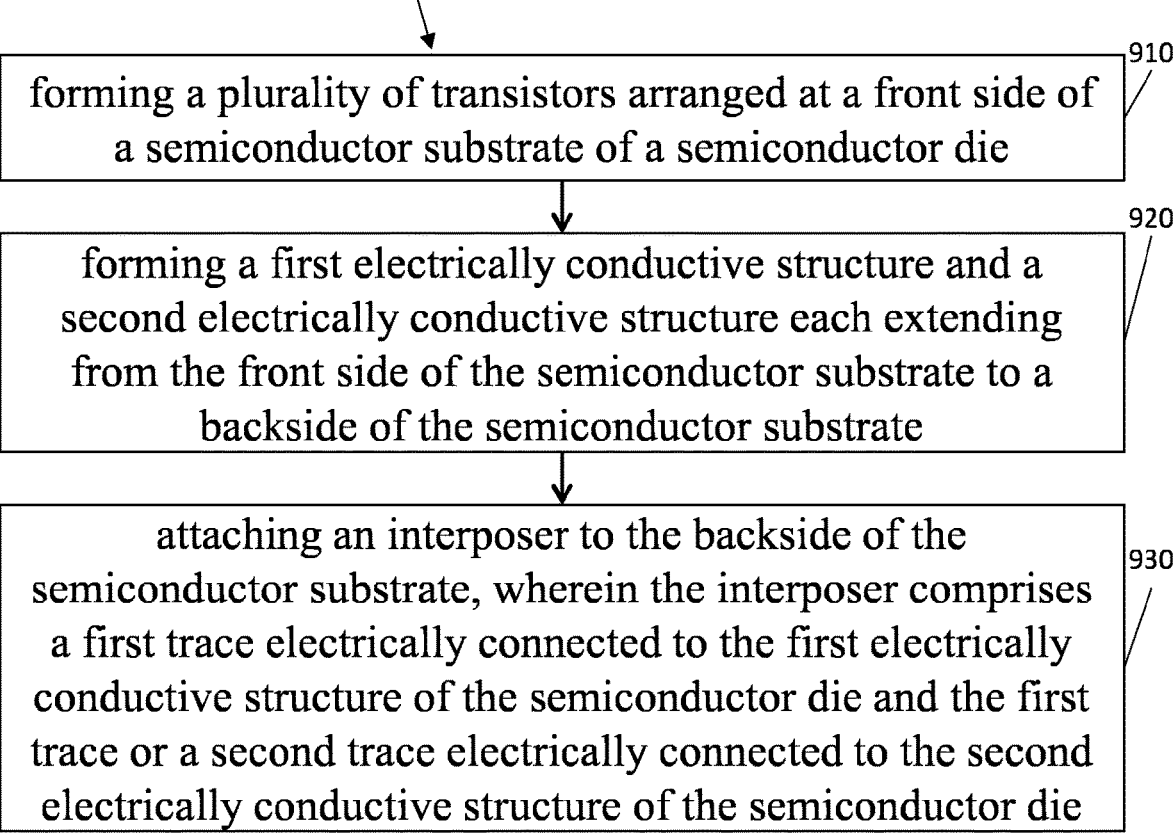

900 forming a plurality of transistors arranged at a front side of a semiconductor substrate of a semiconductor die                                          910 forming a first electrically conductive structure and a second electrically conductive structure each extending from the front side of the semiconductor substrate to a backside of the semiconductor substrate                                          920 attaching an interposer to the backside of the semiconductor substrate, wherein the interposer comprises a first trace electrically connected to the first electrically conductive structure of the semiconductor die and the first trace or a second trace electrically connected to the second electrically conductive structure of the semiconductor die                                          930

Fig. 9

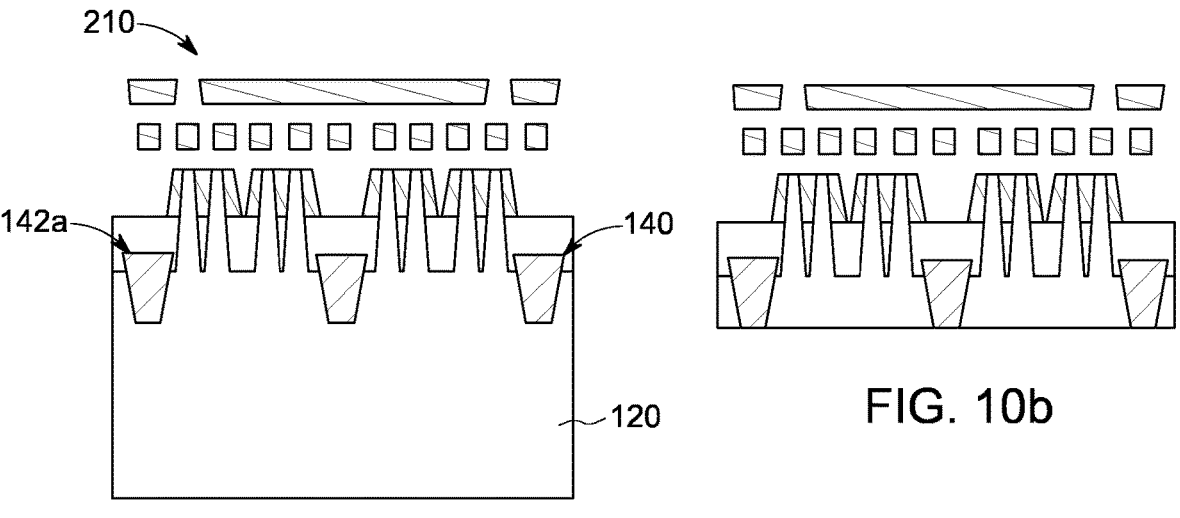
FIG. 10a
FIG. 10b
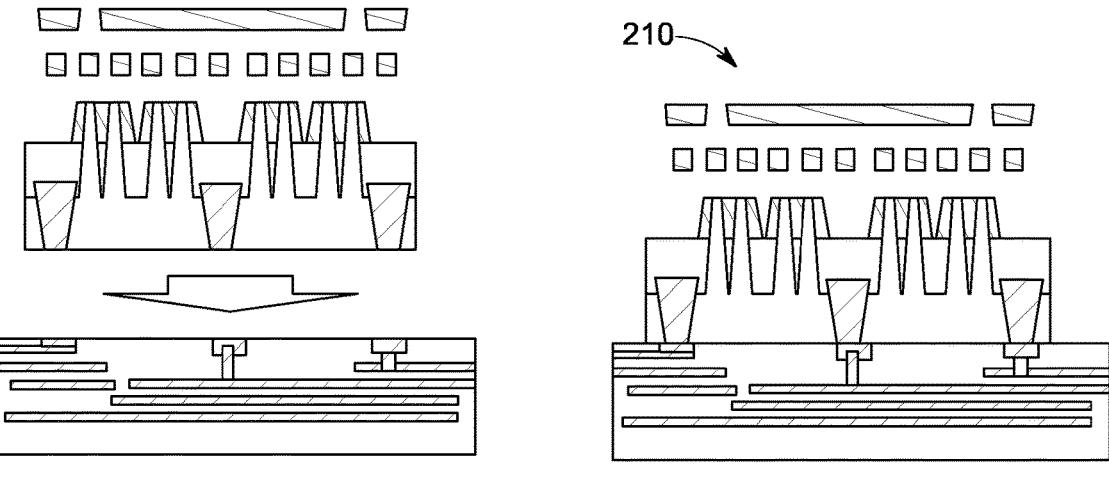
FIG. 10c
FIG. 10d

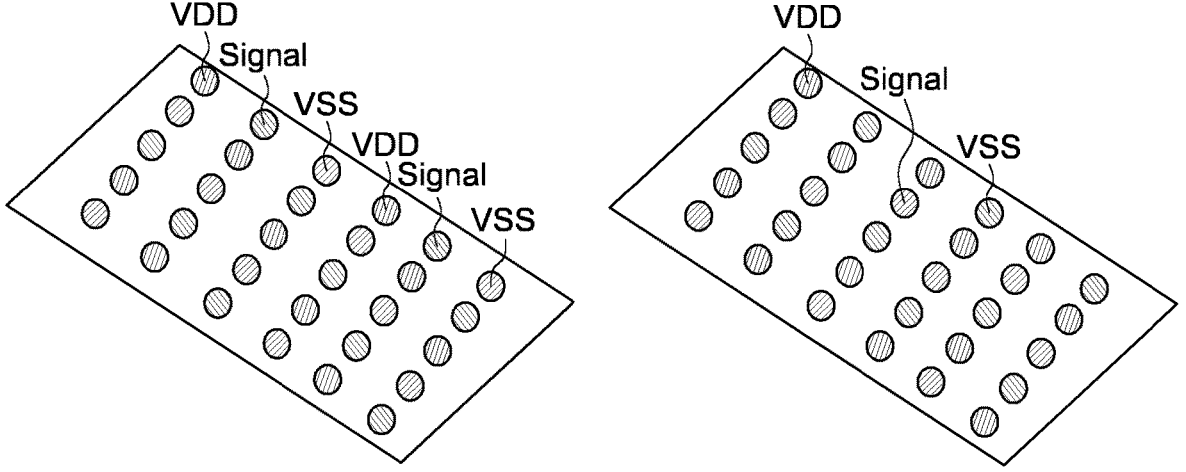
FIG. 12F                    FIG. 12G

SEMICONDUCTOR DEVICES AND METHODS FOR FORMING A SEMICONDUCTOR DEVICE

FIELD

The present disclosure relates to the field of semiconductor devices. In particular, examples relate to semiconductor devices and methods for forming a semiconductor device.

BACKGROUND

The shrinkage of advanced semiconductor technologies is mandatory to create silicon dies with new and improved functionality. This shrinkage is limited by an input/output (I/O) of signals and/or a power functionality of a silicon die due to the footprint of elements (e.g., of vias). For example, to get more signals and power to the silicon die a metallization and routing density may be increased. However, there is still a limit of routing capability of the silicon die and a limit of the power which can be applied. Thus, there may be a need for an improved concept for providing power to the silicon die.

BRIEF DESCRIPTION OF THE FIGURES

Some examples of apparatuses and/or methods will be described in the following by way of example only, and with reference to the accompanying figures, in which

FIG. 9 shows an example of a method for forming a semiconductor device;

FIGS. 10a to 10d show another method for forming the semiconductor device;

DETAILED DESCRIPTION

Various examples will now be described more fully with reference to the accompanying drawings in which some examples are illustrated. In the figures, the thicknesses of lines, layers and/or regions may be exaggerated for clarity.

Accordingly, while further examples are capable of various modifications and alternative forms, some particular examples thereof are shown in the figures and will subsequently be described in detail. However, this detailed description does not limit further examples to the particular forms described. Further examples may cover all modifications, equivalents, and alternatives falling within the scope of the disclosure. Like numbers refer to like or similar elements throughout the description of the figures, which may be implemented identically or in modified form when compared to one another while providing for the same or a similar functionality.

It will be understood that when an element is referred to as being "connected" or "coupled" to another element, the elements may be directly connected or coupled or via one or more intervening elements. If two elements A and B are combined using an "or", this is to be understood to disclose all possible combinations, i.e. only A, only B as well as A and B. An alternative wording for the same combinations is "at least one of the group A and B". The same applies for combinations of more than 2 Elements.

The terminology used herein for the purpose of describing particular examples is not intended to be limiting for further examples. Whenever a singular form such as "a," "an" and "the" is used and using only a single element is neither explicitly or implicitly defined as being mandatory, further examples may also use plural elements to implement the same functionality. Likewise, when a functionality is subsequently described as being implemented using multiple elements, further examples may implement the same functionality using a single element or processing entity. It will be further understood that the terms "comprises," "comprising," "includes" and/or "including," when used, specify the presence of the stated features, integers, steps, operations, processes, acts, elements and/or components, but do not preclude the presence or addition of one or more other features, integers, steps, operations, processes, acts, elements, components and/or any group thereof.

Unless otherwise defined, all terms (including technical and scientific terms) are used herein in their ordinary meaning of the art to which the examples belong.

Figure 1:
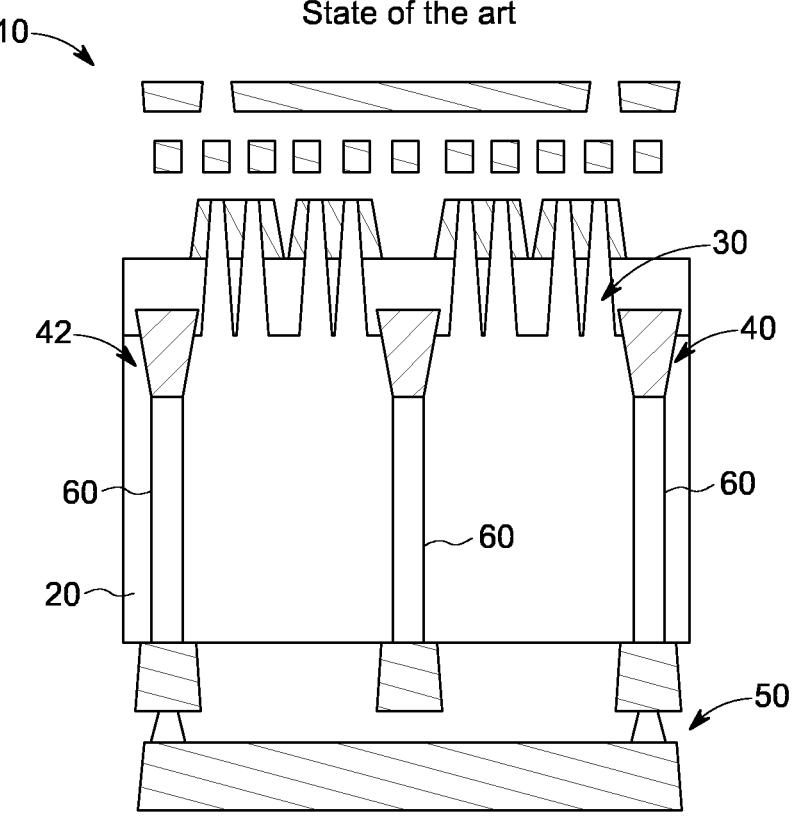
FIG. 1 shows a cross-sectional view of a semiconductor device.

FIG. 1 shows a cross-sectional view of a semiconductor device 10. The semiconductor device 10 comprises a semiconductor substrate 20 and a plurality of transistors 30. The plurality of transistors 30 is arranged at a front side of the semiconductor substrate 20. Further the semiconductor device 10 comprises a first electrically conductive structure 40 and a second electrically conductive structure 42. The first 40 and the second 42 electrically conductive structures extend from the front side of the semiconductor substrate 20 to a backside of the semiconductor substrate. At the backside of the semiconductor substrate is a power delivery network 50 (PDN) attached. A typical backside PDN known from the art comprises micro through silicon vias (μTSVs) and a power/ground metal stack on the backside (including a backside metallization) of the semiconductor substrate 20.

Figure 2A:
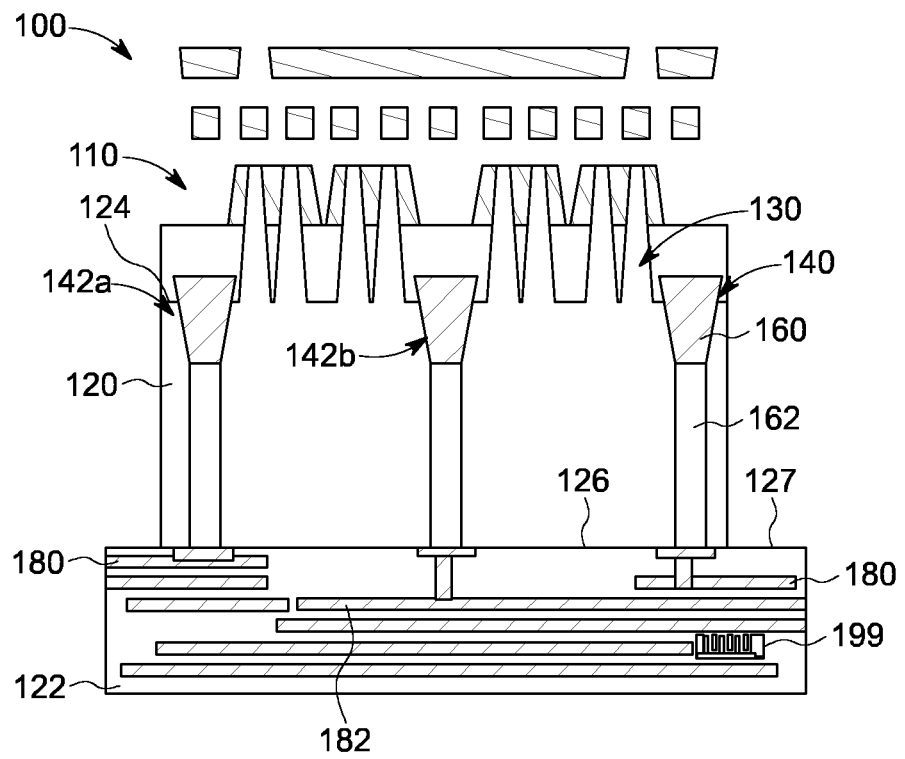
FIGS. 2a to 2b show cross-sectional views of different examples of a semiconductor device.

FIG. 2a shows a cross-sectional view of an example of a semiconductor device 100. The semiconductor device 100 comprises a semiconductor die 110 comprising a semiconductor substrate 120 and a plurality of transistors 130 arranged at a front side of the semiconductor substrate 124. Further, the semiconductor die comprises a first electrically conductive structure 140 extending from the front side of the semiconductor substrate 124 to a backside of the semiconductor substrate 126 and a second electrically conductive structure 142a/142b extending from the front side of the semiconductor substrate 124 to the backside of the semiconductor substrate 126. The semiconductor device 100 further comprises an interposer 122 directly attached to the backside of the semiconductor substrate 126. The interposer 122 comprises a first trace 180 electrically connected to the first electrically conductive structure 140 of the semiconductor die 110. Further the interposer 122 comprises the first trace 180 or a second trace 182 electrically connected to the second electrically conductive structure 142a/142b of the semiconductor die 110.

By attaching the interposer 122 directly to the backside of the semiconductor substrate 126, e.g., a power supply can be improved by delivering the power horizontally from a side or vertically from an opposite side of the interposer 122.

For example, a length of the first 140 and second electrically conductive structure 142a/142b (and hence a thickness of the semiconductor substrate 120) can be adjusted to a desired value, e.g., a maximal length allowed to achieve a desired I/O operation and/or a power functionality of the semiconductor die 110. Since the interposer 122 is attached directly to the backside of the semiconductor substrate 126 the backside of the semiconductor substrate 126 can be processed in a desired way, e.g., a thickness of the semiconductor substrate 120 can be reduced, e.g., by etching, polishing, etc., the backside of the semiconductor substrate 126, e.g. by chemical mechanical polishing. Further processing steps like forming a backside metallization can be omitted.

Moreover, a temperature regulation of the semiconductor device 100 can be improved, e.g., due to an improved cooling of the semiconductor die 110 by the interposer 122. By attaching the interposer 122 directly to the backside of the semiconductor substrate 126 a heat transfer may be improved, e.g., an area for the heat transfer may be increased (e.g., to the entire backside of the semiconductor substrate 126).

Further, by utilizing the interposer 122 instead of a PDN known from the art an integration of an electrical element can be eased. For example, an electrical element such like an active or a passive circuitry (e.g., transistors, diodes, resistors, inductors, and capacitors, diodes, transformers, sensors, electrostatic discharge (ESD) devices, and memory devices among others) may be embedded into the interposer 122. Thus, a wiring length needed to contact the plurality of transistors 130 with the electrical element, e.g., a deep trench capacitor 199 for buffering a transistor, can be reduced. Optionally, additional components (not shown), such as surface-mount resistors, capacitors, and/or inductors, may be disposed on the front side or the back side of the interposer 122. Alternatively, the interposer 122 may only comprise the conductive traces.

Additionally, by attaching the interposer 122 directly to the backside of the semiconductor substrate 126 a positioning freedom of an external power supply can be increased, since a connection for connecting the external power supply can be arranged at a front side or a backside of the interposer. Thus, the power supply can be arranged above or below the semiconductor device 100 in an eased way. For example, the interposer 122 can comprise two connections for connecting the external power supply, one connection arranged at the front side and one connection arranged at the backside of the interposer. This way, the interposer 122 can be used either to arrange the external power supply above or below the semiconductor device 100.

The interposer 122 can be utilized not only for forming a semiconductor device, but also for forming an electronic package with any desired electrical element, e.g., a photonic chip, an antenna, etc.

For example, the first trace 180 is connected to the first electrically conductive structure 140 and the second electrically conductive structure 142a. Thus, the first electrically conductive structure 140 and the second electrically conductive structure 142a can be feed with the same power voltage in an improved way, e.g., with $V_{DD}$ or $V_{SS}$.

Alternatively, the first trace 180 is connected to the first electrically conductive structure 140 and the second trace 182 is connected with the second electrically conductive structure 142b. Thus, a transistor of the plurality of transistors 130 can be feed by the interposer 122 in an improved way.

The semiconductor die 110 can be a first semiconductor die 110, e.g., a second semiconductor die can also be attached to the interposer 122 (see e.g., FIG. 8). Various ones of the embodiments disclosed herein provide in-package interposers 122 to which multiple semiconductors dies may be coupled.

The semiconductor substrate 120 may comprise any type of substrate. For example, the semiconductor substrate 120 may comprise or may be composed of a single crystal of a material which may include, but is not limited to, silicon, germanium, silicon-germanium, germanium-tin, silicon-germanium-tin, or a group III-V compound semiconductor material. The semiconductor substrate may be a bulk substrate or may be part of a semiconductor-on-insulator SOI substrate.

The interposer 122 may comprise any type of material. For example, the interposer 122 may comprise an insulating material, e.g., a dielectric material, such as bismaleimide triazine, silicon composites, glass, an epoxy resin, a ceramic material, or a polymer material such as polyimide. In some embodiments, glass cloth fibers (e.g., a fiberglass-reinforced epoxy resin) or other additives may be included in the insulating material to provide further mechanical rigidity to the interposer 122. Alternatively, the interposer may comprise the same material described above for use in the semiconductor substrate 120.

The first electrically conductive structure 140 and the second electrically conductive structure 142a/142b may be formed of any suitable material, such as a metal (e.g., copper) or other electrically conductive material.

Although FIG. 2 (and others of the accompanying drawings) illustrate a specific number and arrangement of conductive traces 180, 182 in the interposer 122, these are simply illustrative, and any suitable number and arrangement may be used. The conductive traces 180, 182 disclosed herein (e.g., including the first trace 180 and the second trace 182) may be formed of any appropriate conductive material, such as copper, silver, nickel, gold, aluminum, other metals or alloys, or combinations of materials, for example.

The interposer 122 may comprise an integrated shielding structure to electromagnetically shield the first trace 180 and the second trace 182 within the interposer to reduce crosstalk.

The interposer 122 may comprise a security element, such like a security routing and/or a shielding. The interposer 122 may also provide mechanical support to the semiconductor device 100 by acting as a stiffener and reducing the likelihood of mechanical failure due to warpage. The additional stiffening provided by the interposer 122 disclosed herein may be particularly advantageous, e.g., for a thinned substrate, such like a thinned substrate to achieve a desired power functionality.

The first trace 180 and the second trace 182 may be oriented substantially parallel to the front side of the semiconductor substrate 124. Although all of the (conductive) traces illustrated in FIG. 2 (including the first 180 and the second trace 182) are substantially "linear" between opposite sides of the interposer, need not be linear and may, for example, comprise lateral extents. In some embodiments, the first trace 180 and/or the second trace 182 may comprise a pillar of conductive material (e.g., a metal, such as copper), a through-hole plated with a conductive material, a via filled with a conductive material, a vertical or planer trace, a wire, or any other conductive trace along which electrical signals are to flow, e.g., to contact the substantially parallel traces to the first 140 and the second electrically conductive structure 142a/142b and/or to conductive pads on a backside of the interposer. Other conductive elements may be disposed between or around multiple different vias in a trace.

The interposer 122 may be attached to the backside of the semiconductor substrate 126 by a direct bonding (DB) process, e.g., a front side of the interposer 127 (and the backside of the semiconductor substrate 126) may comprise a DB region. As used herein, the term "direct bonding" is used to include metal-to-metal bonding techniques (e.g., copper-to-copper bonding, or other techniques in which the DB contacts of opposing DB interfaces are brought into contact first, then subject to heat and compression) and hybrid bonding techniques (e.g., techniques in which the DB dielectric of opposing DB interfaces are brought into contact first, then subject to heat and sometimes compression, or techniques in which the DB contacts and the DB dielectric of opposing DB interfaces are brought into contact substantially simultaneously, then subject to heat and compression). In such techniques, the DB contacts and the DB dielectric at one DB interface are brought into contact with the DB contacts and the DB dielectric at another DB interface, respectively, and elevated pressures and/or temperatures may be applied to cause the contacting DB contacts and/or the contacting DB dielectrics to bond. In some embodiments, this bond may be achieved without the use of intervening solder or an anisotropic conductive material, while in some other embodiments, a thin cap of solder may be used in a DB interconnect to accommodate planarity, and this solder may become an intermetallic compound (IMC) in the DB region during processing. In some embodiments, this bond may be achieved by use of copper-copper bonding. DB interconnects may be capable of reliably conducting a higher current than other types of interconnects; for example, some conventional solder interconnects may form large volumes of brittle IMCs when current flows, and the maximum current provided through such interconnects may be constrained to mitigate mechanical failure.

A DB dielectric may include one or more dielectric materials, such as one or more inorganic dielectric materials. For example, a DB dielectric may include silicon and nitrogen (e.g., in the form of silicon nitride); silicon and oxygen (e.g., in the form of silicon oxide); silicon, carbon, and nitrogen (e.g., in the form of silicon carbonitride); carbon and oxygen (e.g., in the form of a carbon-doped oxide); silicon, oxygen, and nitrogen (e.g., in the form of silicon oxynitride); aluminum and oxygen (e.g., in the form of aluminum oxide); titanium and oxygen (e.g., in the form of titanium oxide); hafnium and oxygen (e.g., in the form of hafnium oxide); silicon, oxygen, carbon, and hydrogen (e.g., in the form of tetraethyl orthosilicate (TEOS)); zirconium and oxygen (e.g., in the form of zirconium oxide); niobium and oxygen (e.g., in the form of niobium oxide); tantalum and oxygen (e.g., in the form of tantalum oxide); and combinations thereof.

A DB contact may include a pillar, a pad, or other structure. The DB contacts may have a same structure at both DB interfaces (the front side of the interposer 127 and the backside of the semiconductor substrate 127), or the DB contacts at different DB interfaces may have different structures. For example, in some embodiments, a DB contact in one DB interface may include a metal pillar (e.g., a copper pillar), and a complementary DB contact in a complementary DB interface may include a metal pad (e.g., a copper pad) recessed in a dielectric. A DB contact may include any one or more conductive materials, such as copper, manganese, titanium, gold, silver, palladium, nickel, copper and aluminum (e.g., in the form of a copper aluminum alloy), tantalum (e.g., tantalum metal, or tantalum and nitrogen in the form of tantalum nitride), cobalt, cobalt and iron (e.g., in the form of a cobalt iron alloy), or any alloys of any of the foregoing (e.g., copper, manganese, and nickel in the form of manganin). In some embodiments, the DB dielectric and the DB contacts of a DB interface may be manufactured using low-temperature deposition techniques (e.g., techniques in which deposition occurs at temperatures below degrees Celsius, or below degrees Celsius), such as low-temperature plasma-enhanced chemical vapor deposition (PECVD).

The semiconductor die 110 comprised by the semiconductor device 100 may take any suitable form. For example, the semiconductor die 110 may be a memory die, a logic die (e.g., a central processing unit (CPU) or other processor), a sensor die, or a platform controller hub, or may include any combination of circuits having these functions.

The elements of the semiconductor device 100 may have any suitable dimensions. In some embodiments, the thickness of the interposer 122 may be at most 100 μm, or at most 80 μm or at most 50 μm and/or at least 20 μm or 30 μm or 40 μm. In some embodiments, a thickness of a semiconductor substrate 120 may be at most 100 μm, or at most 80 μm or at most 50 μm and/or at least 20 μm or 30 μm or 40 μm. In some embodiments a distance between the first electrically conductive structure and the second electrically conductive structure may be at most 65 μm or at most 40 μm or at most 20 μm and/or at least 0.4 μm or 1 μm or 10 μm.

In an example, the first electrically conductive structure 140 may be arranged vertically between a gate of a transistor of the plurality of transistors 130 and the semiconductor substrate 120. Optionally or additionally, the second electrically conductive structure 142a/142b may be arranged vertically between a gate of a transistor of the plurality of transistors 130 and the semiconductor substrate 120.

In an example, the first electrically conductive structure 140 may comprise an electrically conductive line 160 (e.g., for a power supply, a signal, etc.) e.g., a power supply line 160, connected to a through substrate via (TSV) 162. For example, the electrically conductive line 160 may be partially buried inside of the semiconductor substrate 120. Thus, by connecting the electrically conductive line 160 with a TSV 162 the first electrically conductive structure 140 extending from the front side of the semiconductor substrate 124 to the backside of the semiconductor substrate 126 can be formed. The TSV and the power supply may be perpendicular to the front side of the semiconductor substrate 124. A thickness of the semiconductor substrate 120 and thus a length of the TSV can be adjusted as described above.

Figure 2B:
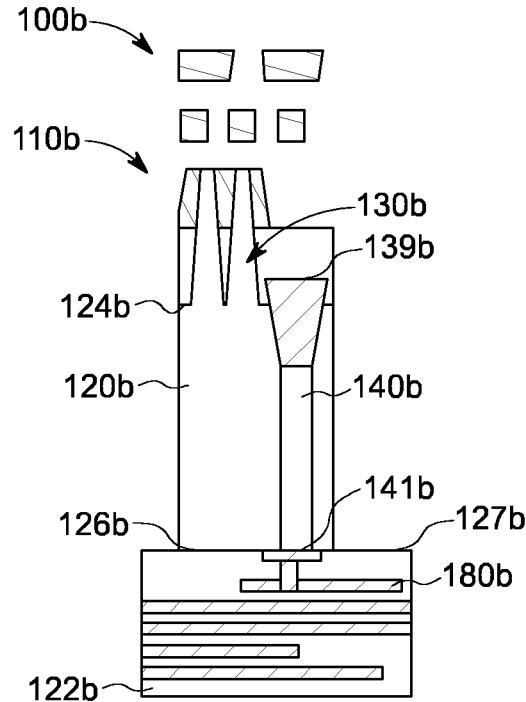

FIG. 2b shows a semiconductor die 110b comprising a semiconductor substrate 120b and plurality of transistors 130b arranged at a front side of the semiconductor substrate 124b. The semiconductor die 110b comprises an electrically conductive line 140b for providing an electrical signal (e.g., a supply voltage) for the plurality of transistors 130b. The electrically conductive line 140b comprises a top surface 139b at the front side of the semiconductor substrate 124b and a bottom surface 141b at the backside of the semiconductor substrate 126b. Further, the interposer 122b is attached to the semiconductor die 110b so that a trace 180b of the interposer 122b is electrically connected to the bottom surface of the electrically conductive line 140b of the semiconductor die 110b. As described above, by attaching the interposer 122b to the backside of the semiconductor substrate 126b a power supply can be improved by delivering the power horizontally from a side of the interposer 122b and reducing the length of the vertical power supply. In an example, a backside of the semiconductor substrate 126b is directly attached to a front side of the interposer 127b.

More details and aspects are mentioned in connection with the examples described above below. The example shown in FIG. 2 may comprise one or more optional additional features corresponding to one or more aspects mentioned in connection with the proposed concept or one or more examples described below (e.g., FIG. 3-13).

Figure 3:
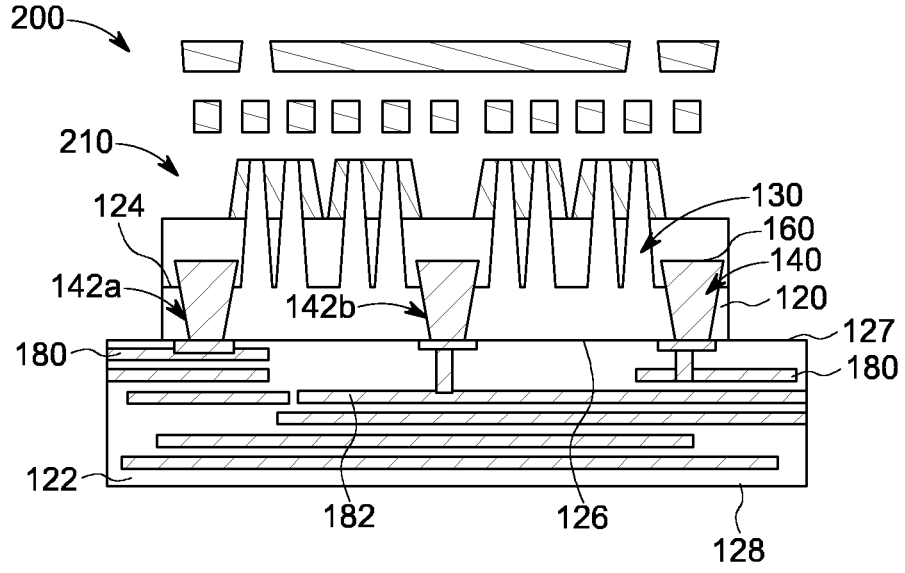
FIG. 3 shows a cross-sectional view of another example of a semiconductor device.

FIG. 3 shows a cross-sectional view of another example of a semiconductor device 200. The semiconductor device comprises a semiconductor die 210 comprising a semiconductor substrate and an interposer 122. The semiconductor device 200 may be identical to the semiconductor device as described with reference to FIG. 2 except of the TSV. In contrast to the example described with reference to FIG. 2 (and to the-state-of-the-art described with reference to FIG. 1), the semiconductor die 210 has no TSV formed through the semiconductor substrate 120. Thus, a processing of the semiconductor device 210 can be eased, since no TSV has to be formed.

In an example, the semiconductor substrate 120 may have no metallization on the backside. Thus, in comparison to the state-of-the-art described with reference to FIG. 1 a backside metallization (process) can be omitted, which may reduce manufacturing cost/time of the semiconductor device 200.

In an example, the plurality of transistors 130 may be fin field-effect transistors, a nanowire transistor, a ribbon transistor or a gate all around transistor. A gate all around transistor is a structure where the gate contacts the channel from all sides.

In an example, the interposer 122 may have no contact on a backside 180. For example, a contact for connecting an external power supply may be formed on a front side of the interposer 127.

In an example, the first trace 180 and the second trace 182 may be electrically connected, respectively, to the first electrically conductive structure and the second electrically conductive structure, and/or the power supply by a direct copper to copper connection. Thus, a good electrically connection can be ensured.

More details and aspects are mentioned in connection with the examples described above and/or below. The example shown in FIG. 3 may comprise one or more optional additional features corresponding to one or more aspects mentioned in connection with the proposed concept or one or more examples described above (e.g., FIG. 2) and/or below (e.g., FIG. 4-13).

Figure 4A:
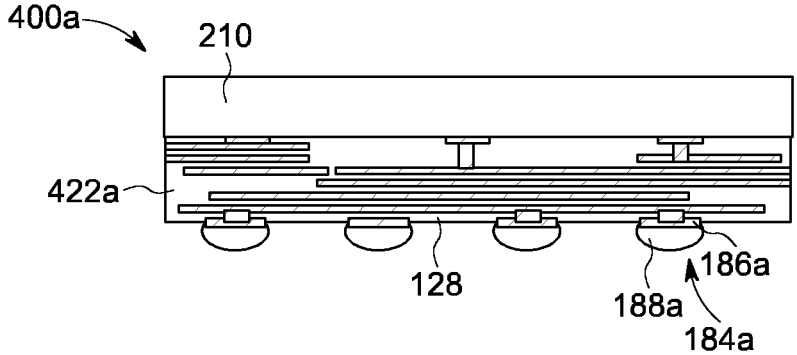
FIGS. 4a to 4b show cross-sectional views of different other examples of semiconductor devices.

FIG. 4 shows cross-sectional views of different other examples of semiconductor devices 400a, 400b. FIG. 4a shows a semiconductor device 400a comprising an interposer 422a and a semiconductor substrate 210. In an example, the interposer 422a may comprise a package contact interface 184a for direct connection to a circuit board.

The first trace and the second trace may each be electrically coupled to a package contact interface 184a, which may comprise conductive contacts 186a formed on the backside of the interposer 128 and a solder 188. The conductive contacts 186a of the interposer 122 may be metal pads, for example. In some embodiments, the solder 188 may take the form of a solder ball. Thus, the interposer can be directly electrically coupled to the circuit board.

Figure 4B:
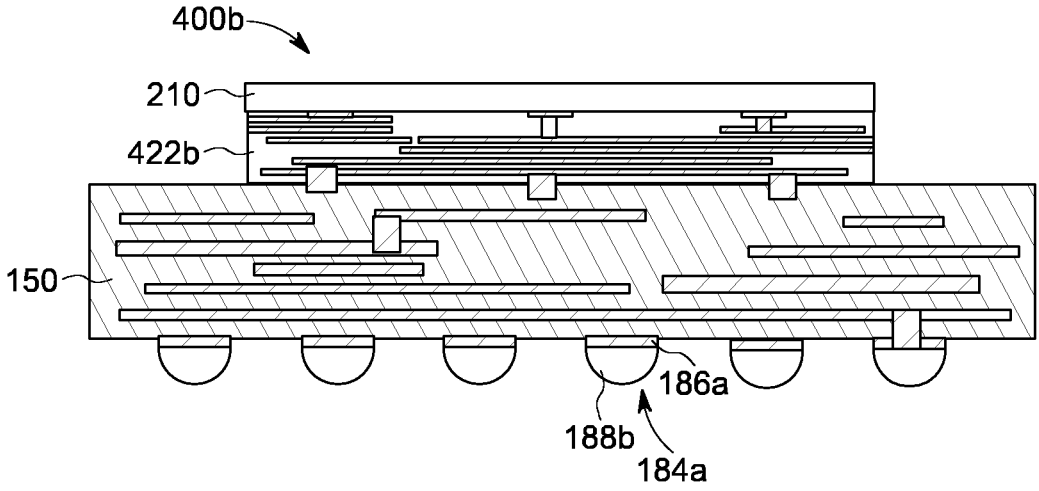

FIG. 4b shows a semiconductor device 400b comprising a package structure 150 an interposer 422b and a semiconductor substrate 210. In an example, the package structure 150 may be at least one of a substrate, a redistribution layer or a lead frame. The interposer 422b may comprise a substrate contact interface at a backside to electrically contact the interposer 422b to the package structure 150, e.g., by an interposer contact interface on a front side of the package structure 150. For example, a front side of the package structure may be bonded onto a backside of the interposer, e.g., by an adhesive or by DB.

The package substrate 150 may include further conductive traces to route signals from the interposer 422b (e.g., from the first trace and the second trace) to the conductive contacts 186b, and from there to another component to which the semiconductor device 400b may be coupled via a solder 188b (e.g., a circuit board, another interposer, or another package). In some embodiments, the solder 188b may take the form of a solder ball. In some examples, the package substrate 150 may comprise a package substrate contact interface 184b for direct connecting the package substrate 150 to a circuit board.

The substrate of the package substrate 150 may be formed of any suitable substrate materials, such as any material described above with reference to the interposer. The lead frame of the package substrate 150 may be a conductive plate, e.g., a metal or an alloy, mainly containing copper or copper-nickel, or a sheet metal made of an alloy prepared by further adding active metal elements such as titanium and chromium thereto or a stripe. The redistribution layer of the package substrate 150 may be a conductive material, e.g., a metal or an alloy.

More details and aspects are mentioned in connection with the examples described above and/or below. The example shown in FIG. 4 may comprise one or more optional additional features corresponding to one or more aspects mentioned in connection with the proposed concept or one or more examples described above (e.g., FIG. 2-3) and/or below (e.g., FIG. 5-13).

Figures 5A, 5B, 5C, 5D:
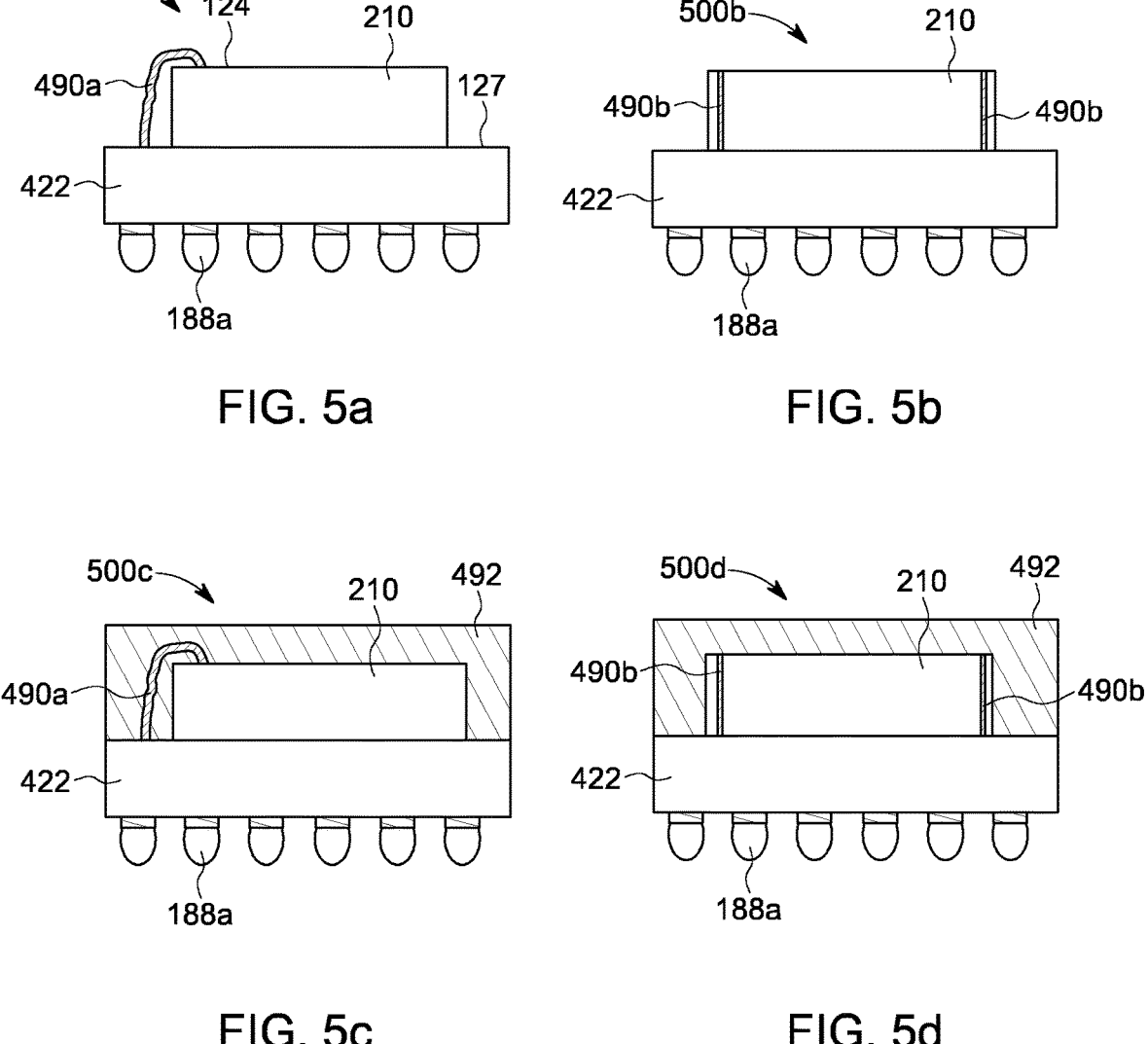
FIGS. 5a to 5d show cross-sectional views of different other examples of semiconductor devices.

FIG. 5 shows cross-sectional views of different other examples of semiconductor devices 500a, 500b, 500c, 500d. As shown in the respective FIG. 5a-5d the semiconductor devices 500a, 500b, 500c, 500d comprises each a semiconductor die 210 and an interposer 422 comprising a package contact interface 188a.

In an example, the front side of the semiconductor substrate 124 may be electrically connected to a front side of the interposer 127 by a wire bond 490a (see e.g., FIG. 5a). Thus, an active area of the semiconductor die 110 can be electrically connected to a power supply by the wire bond 490a. Alternatively, in an example the front side of the semiconductor substrate 124 may be electrically connected to a front side of the interposer 127 by a conductive structure 490b formed during a front-end-of-line (e.g., a TSV) and/or a back-end-of-line process step (e.g. a metallization structure), e.g., a TSV connected to a metallization structure such that the conductive structure extends from the front side of the semiconductor substrate to the backside of the semiconductor substrate (see e.g., FIG. 5b).

In an example, the semiconductor device 500c, 500d may further comprise an encapsulation 492 embedding at least one of the interposer 422 or the semiconductor die 210. The encapsulation may also embed the wire bond 490a.

In an example, the encapsulation 492 may be a mold compound. The mold material may extend around one or more of the electronic components on the interposer 422, e.g., the semiconductor die 210. In some embodiments, the mold material may extend between multiple microelectronic components on the interposer 422 and around the DB region. In some embodiments, the mold material may extend above one or more of the electronic components on an interposer 422. The mold material may be an insulating material, such as an appropriate epoxy material. The mold material may be selected to have a coefficient of thermal expansion (CTE) that may mitigate or minimize the stress between the electronic components and the interposer 422 arising from uneven thermal expansion in the semiconductor device 500*c*, 500*b*. In some embodiments, the CTE of the mold material may have a value that is intermediate to the CTE of the interposer 422 and a CTE of the electronic components. In some embodiments, the mold material used in the semiconductor device 500*c*, 500*b* may be selected at least in part for its thermal properties. For example, one or more mold materials used in the semiconductor device 500*c*, 500*b* may have low thermal conductivity (e.g., conventional mold compounds) to retard heat transfer, or may have high thermal conductivity (e.g., mold materials including metal or ceramic particles with high thermal conductivity, such as copper, silver, diamond, silicon carbide, aluminum nitride, and boron nitride, among others) to facilitate heat transfer. Any of the mold materials referred to herein may include one or more different materials with different material compositions.

More details and aspects are mentioned in connection with the examples described above and/or below. The example shown in FIG. 5 may comprise one or more optional additional features corresponding to one or more aspects mentioned in connection with the proposed concept or one or more examples described above (e.g., FIG. 2-4) and/or below (e.g., FIG. 6-13).

Figures 6A, 6B, 6C, 6D:
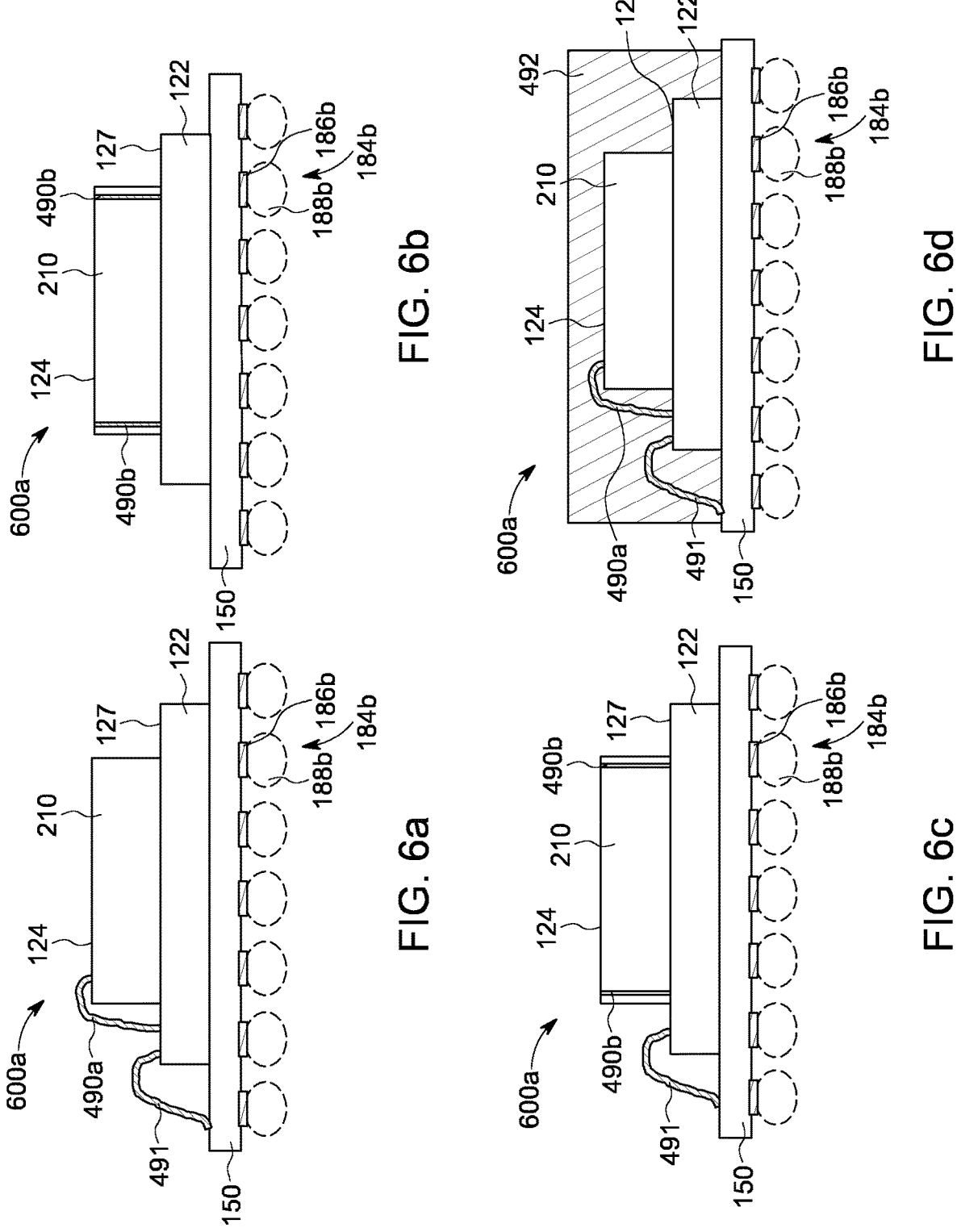
FIGS. 6a to 6f show cross-sectional views of different other examples of semiconductor devices.
Figures 6E, 6F:
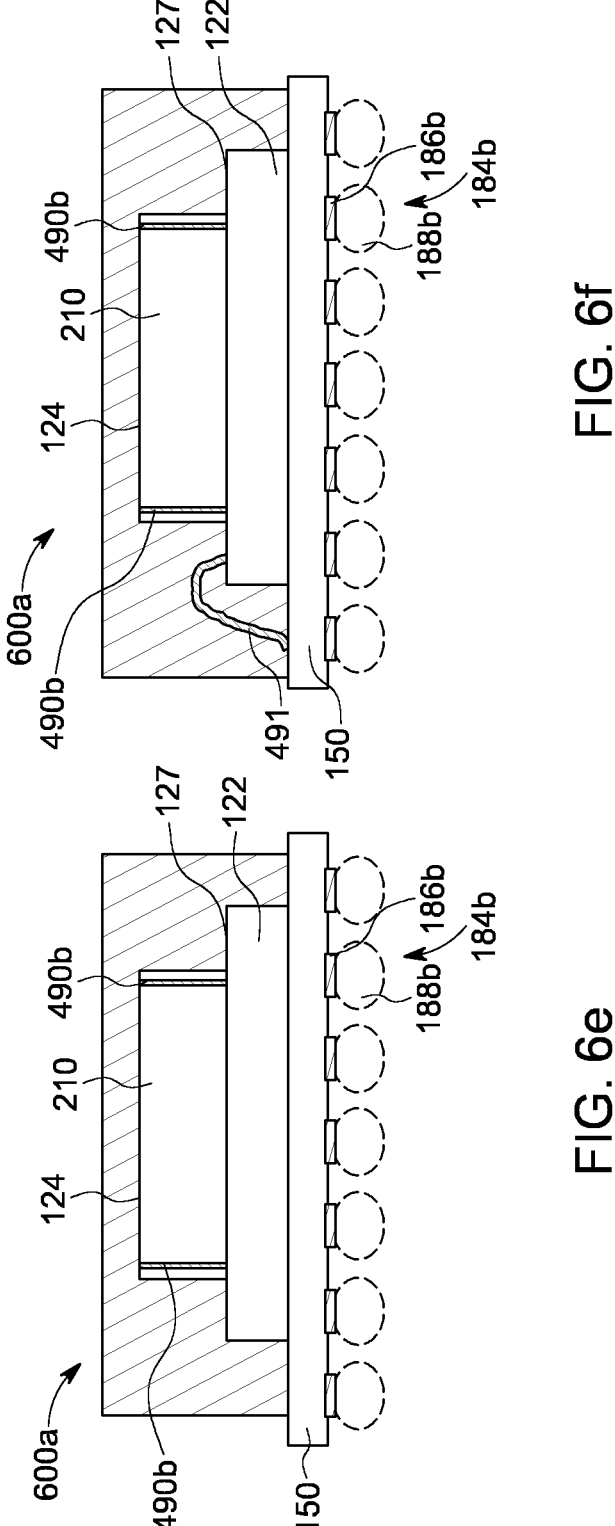

FIG. 6 shows cross-sectional views of different other examples of semiconductor devices 600*a*, 600*b*, 600*c*, 600*d*, 600*e*, 600*f*. As shown in the respective FIG. 6*a*-6*f* the semiconductor devices 600*a*, 600*b*, 600*c*, 600*d*, 600*e*, 600*f* comprises each a semiconductor die 210, an interposer 122 and a package substrate structure 150.

In an example the package structure 150 may be attached to a backside of the interposer 128. In an example, the backside of the interposer 128 may be electrically connected to the package structure 150, e.g., by use of the conductive contacts 186*b*, and from there to another component to which the semiconductor device 400*b* may be coupled via a solder (e.g., a circuit board, another interposer, or another package). In some embodiments, the solder may take the form of a solder ball.

In an example, a front side 127 of the interposer 122 may be electrically connected to the package structure 150 by a wire bond 491 (e.g., see FIG. 6*a*). For example, the front side of the semiconductor substrate 124 may be electrically connected to the package structure 150 by a further wire bond 490*a* (see e.g., FIGS. 5*a*, 5*c*) or alternatively by a structure conductive 490*b* formed during a front-end-of-line and/or a back-end-of-line process step (see e.g., FIGS. 5*b*, 5*d*). Optionally, an encapsulation 492 embedding the interposer 122, the semiconductor die 210 and/or the wire bonds 490*a*, 492 may be comprised by the semiconductor device 600*d*, 600*e*, 600*f* (see FIGS. 6*d*-6*f*). In an example, the encapsulation 492 may embed the package substrate 150, the semiconductor die 210 and/or the interposer 122.

The package structure 150 may comprise a package substrate contact interface 184*b*, which may comprise a conductive contact 184*b* (e.g., if the package substrate 150 is a lead frame) and optionally a solder 188*b* (e.g. if the package substrate 150 is a substrate).

More details and aspects are mentioned in connection with the examples described above and/or below. The example shown in FIG. 6 may comprise one or more optional additional features corresponding to one or more aspects mentioned in connection with the proposed concept or one or more examples described above (e.g., FIG. 2-5) and/or below (e.g., FIG. 7-13).

Figures 7A, 7B, 7C, 7D:
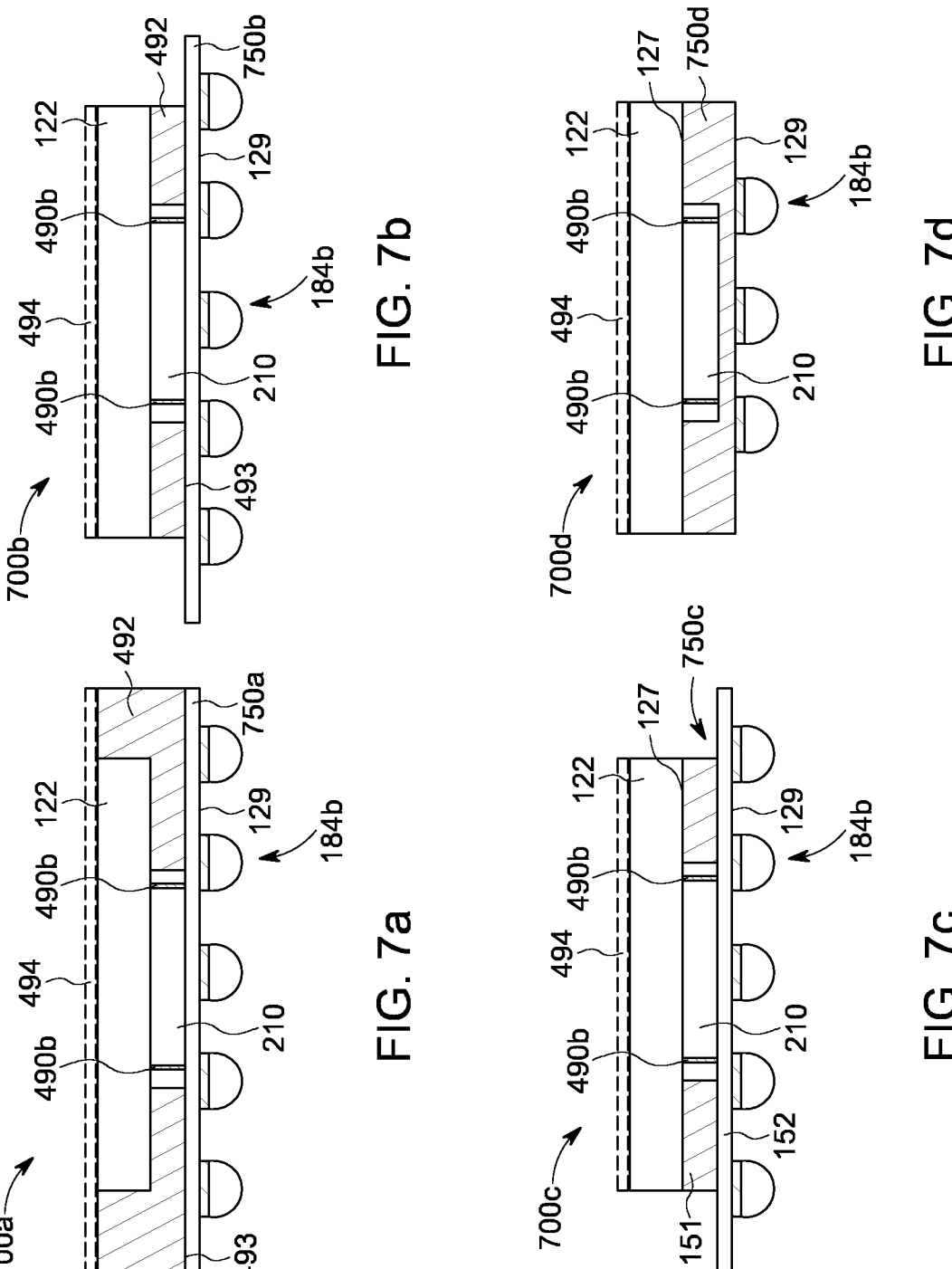
FIGS. 7a to 7h show cross-sectional views of different other examples of (flip-chip) semiconductor devices.
Figures 7E, 7F, 7G, 7H:
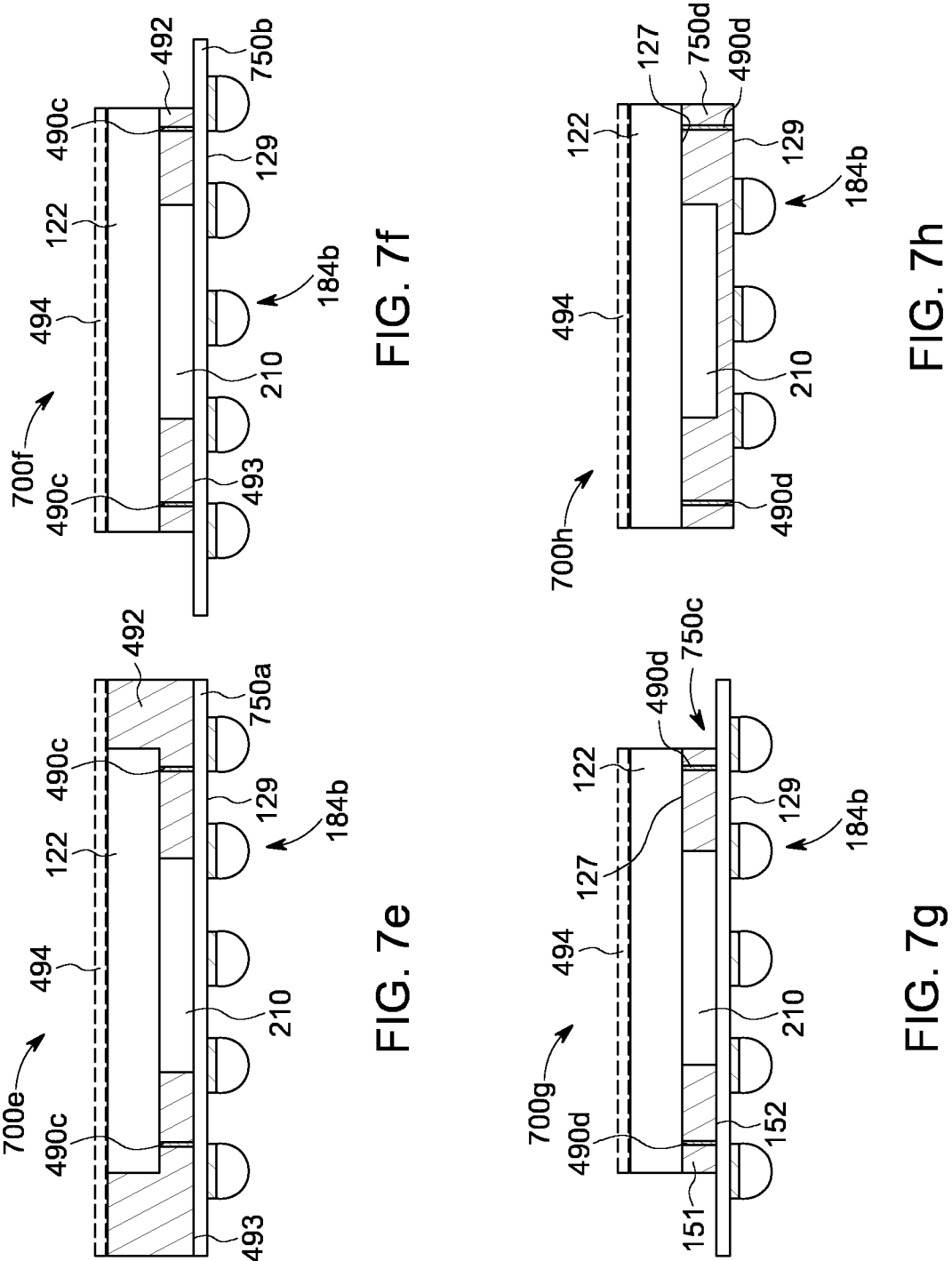

FIG. 7 shows cross-sectional views of different other examples of (flip-chip) semiconductor devices 700*a*, 700*b*, 700*c*, 700*d*, 700*e*, 700*f*, 700*g*, 700*h*. As shown in the respective FIGS. 7*a*-7*d* the semiconductor devices 700*a*, 700*b*, 700*c*, 700*d* comprises each a semiconductor die 210, an interposer 122, a package substrate structure 750*a*, 750*b*, 750*c*, 750*d* and a package substrate contact interface 184*b*. In an example, the semiconductor die 210 may be arranged between the package structure 750*a*, 750*b*, 750*c*, 750*d* and the interposer 122 (see FIGS. 7*a*-7*d*). The package substrate contact interface 184*b* may be arranged at a backside of the package substrate structure 129.

In some examples, the semiconductor device 700*a*, 700*b* may further comprise an encapsulation 492, e.g., a mold compound, which embeds the interposer 122 and the semiconductor die 210. The package substrate structure 750*a*, 750*b* may be arranged at a front side of the encapsulation 492 or at a front side of the interposer 127. A front side of the semiconductor substrate may be connected to a backside of the semiconductor device via conductive structures 184*b*.

In some embodiments, the package substrate 750*c*, 750*d* may embed the semiconductor die 210 (see FIGS. 7*c* and 7*d*). In an example, the semiconductor device 700*c*, 700*d* may comprise a redistribution layer 151. In an example, the redistribution layer 151 may be arranged at the front side of the semiconductor substrate 127. Further, the redistribution layer 151 may embed the semiconductor die 210. The redistribution layer 151 may be a part of the package substrate 750*c*, which may comprise the redistribution layer 151 arranged at a frontside of the interposer 127 and a substrate 152 arranged at a front side of the redistribution layer 151 (see FIG. 7*c*), both embedding the semiconductor die 210. In some embodiments, the package substrate 750*d* may be formed by the redistribution layer 750*d*, which embeds the semiconductor die 210. The package substrate contact interface 184*b* may be formed on a front side of the redistribution layer (see FIG. 7*d*).

The package substrate contact interface 184*b* may be formed by a ball grid array, such that the semiconductor die 210 may be arranged between the ball grid array and the interposer 122.

In an example, the semiconductor device 700*a*, 700*b*, 700*c*, 700*d* may further comprise a heat spreading structure 494. The heat spreading 494 structure is attached to a backside of the interposer 128. Thus, a heat transfer from the semiconductor die 210 through the interposer 122 can be increased, e.g., a cooling of the semiconductor die 210 can be improved.

The front side of the semiconductor substrate may be electrically connected to a front side of the interposer by a conductive structure 490*b*. Further, the front side of the semiconductor substrate may be electrically connected to the package substrate contact interface 184*b*. Alternatively, as can be seen in the FIGS. 7*e*-7*h* the electrical connection between the interposer 122 and the package substrate contact interface 184b can be formed via through mold vias 490c or via pillars, e.g., copper pillars 490d (see FIGS. 7e, 7f and 7g, 7h respectively).

More details and aspects are mentioned in connection with the examples described above and/or below. The example shown in FIG. 7 may comprise one or more optional additional features corresponding to one or more aspects mentioned in connection with the proposed concept or one or more examples described above (e.g., FIG. 2-6) and/or below (e.g., FIG. 8-13).

Figures 8A, 8B:
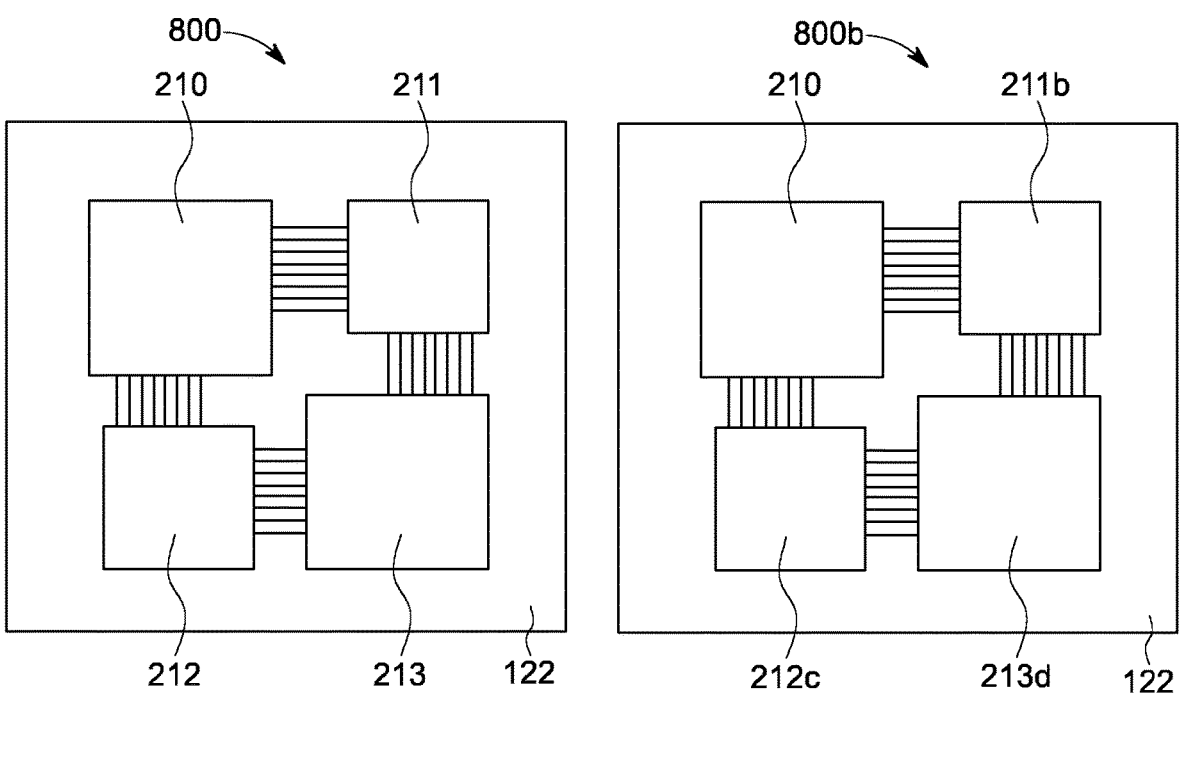
FIGS. 8a to 8e show schematic top/side views of a semiconductor device.

FIG. 8 shows schematic top/side views of a semiconductor device 800, 800b, 800c. The semiconductor device 800 shown in FIG. 8a comprises an interposer 122 and a plurality of semiconductor dies 210, 211, 212, 213 attached to the interposer 122. In an example, the semiconductor device 800 comprises a second semiconductor die 210b, 210c, 210d comprising a semiconductor substrate and a plurality of transistors arranged at a front side of the semiconductor substrate. The second semiconductor die 211, 212, 213 comprises an electrically conductive structure. The interposer 122 may be directly attached with a front side to a backside of the second semiconductor substrate. The interposer 122 comprises a third trace electrically connected to the electrically conductive structure of the second semiconductor die 211, 212, 213. For example, the second semiconductor die 211, 212, 213 may be (nearly) identical to a first semiconductor die 210, e.g., the semiconductor die as describe above (e.g., with reference to FIGS. 2-7).

For example, a backside of the second semiconductor die may be electrically connected to the frontside of the interposer in the same manner as a backside of the first semiconductor die, e.g., via DB. Alternatively, in an example the front side of the interposer may be electrically connected via microbumps with the backside of the second semiconductor. This way, an integration of different semiconductor dies 210, 211, 212, 213 can be eased/enabled, e.g., the second semiconductor die 211, 212, 213 may not be formed for DB.

In an example, a cross section of the first semiconductor die 210 is different from a cross section of the second semiconductor die 211, 212, 123.

FIG. 8b shows an example of a semiconductor device 800b, in which the first semiconductor die 800b may be manufactured by a different technology node, circuit design, etc. than the second semiconductor die 211b, 212c, 213d. This way, the interposer 122 can connect different semiconductor dies 210, 210b, 210c, 210d.

Figures 8C, 8D, 8E:
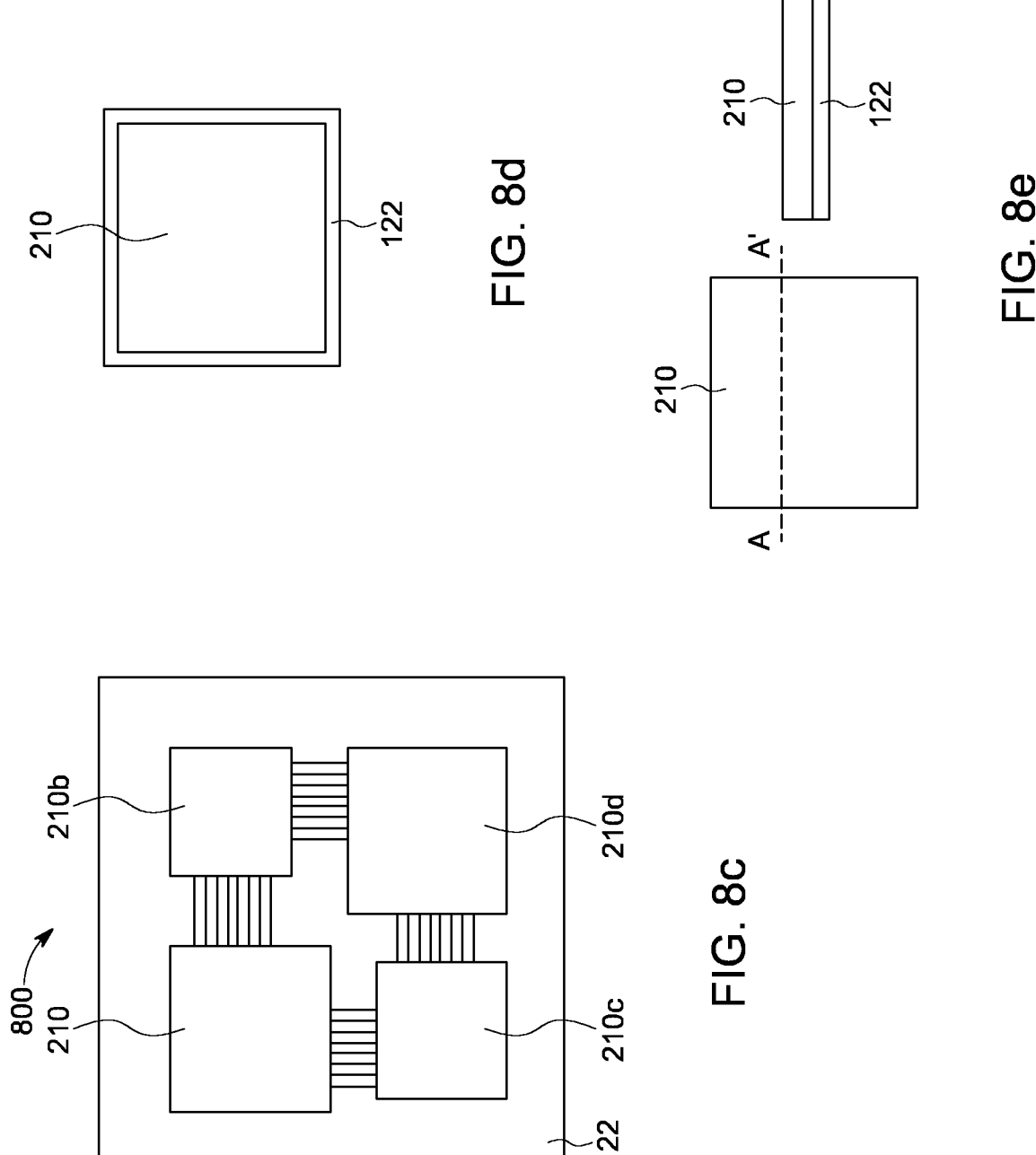
Figure 11A:
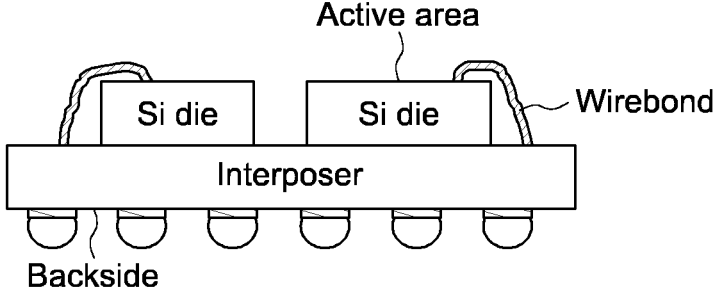
FIGS. 11a to 11n and 11o, o' to 11v, v' show cross-sectional views of different other examples of semiconductor devices.
Figure 11B:
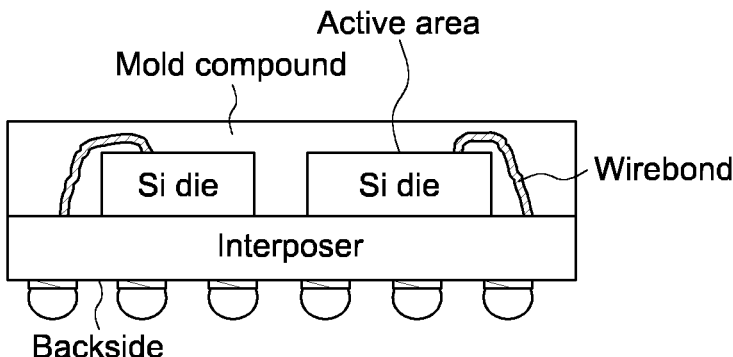
Figure 11C:
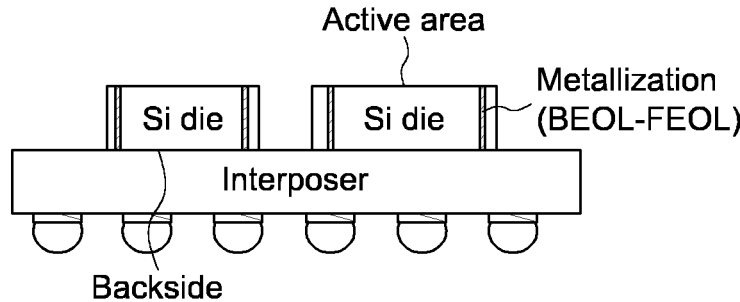
Figure 11D:
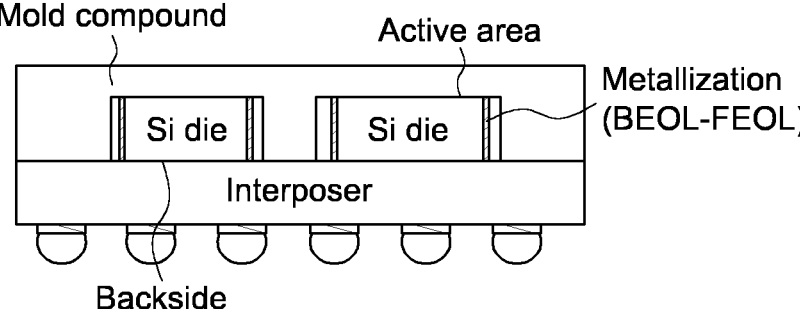
Figure 11E:
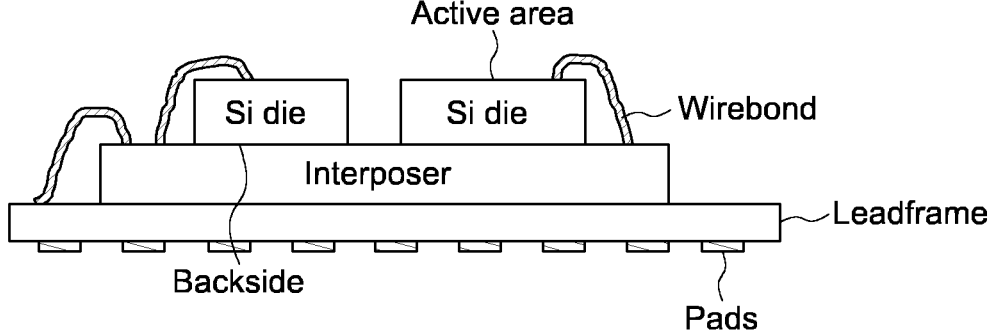
Figure 11F:
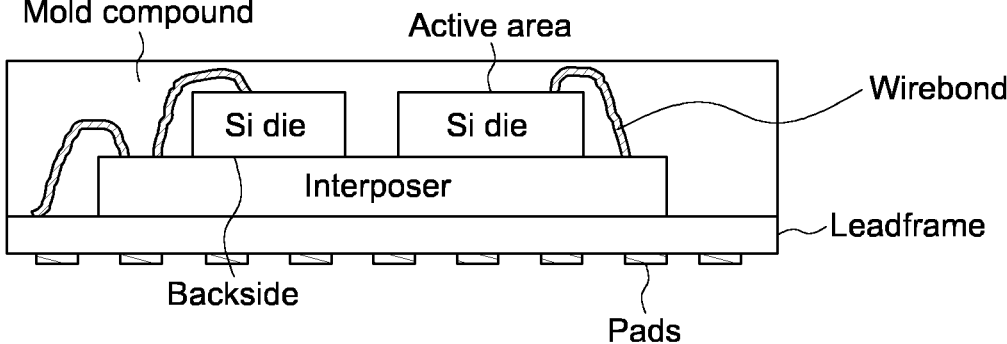
Figure 11G:
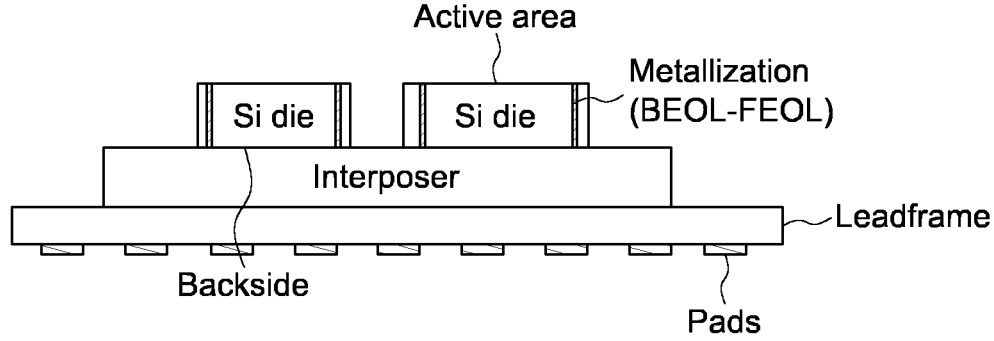
Figure 11H:
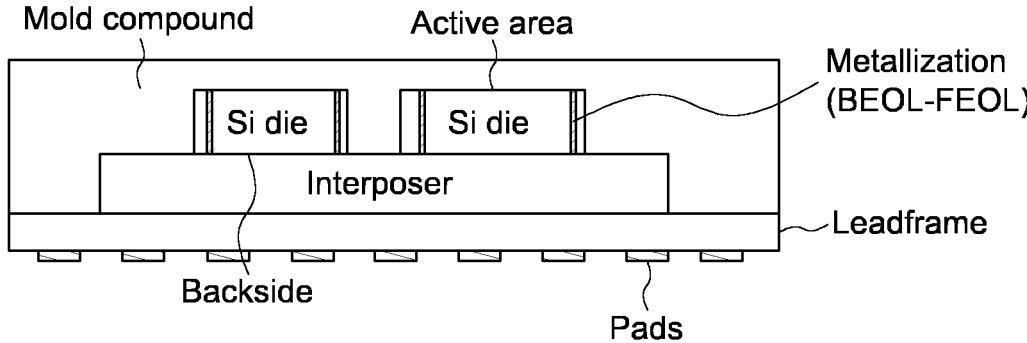
Figure 11I:
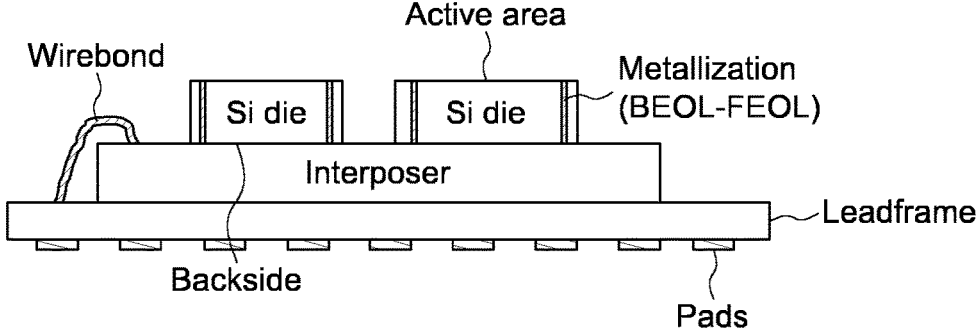
Figure 11J:
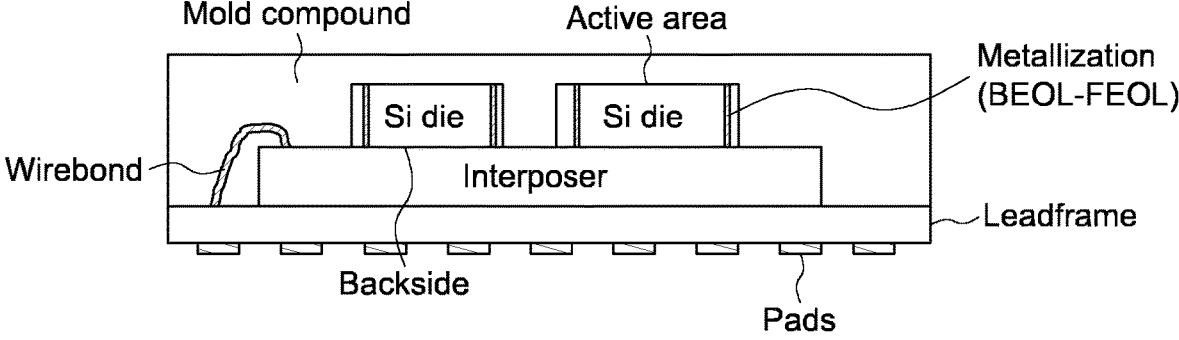
Figure 11K:
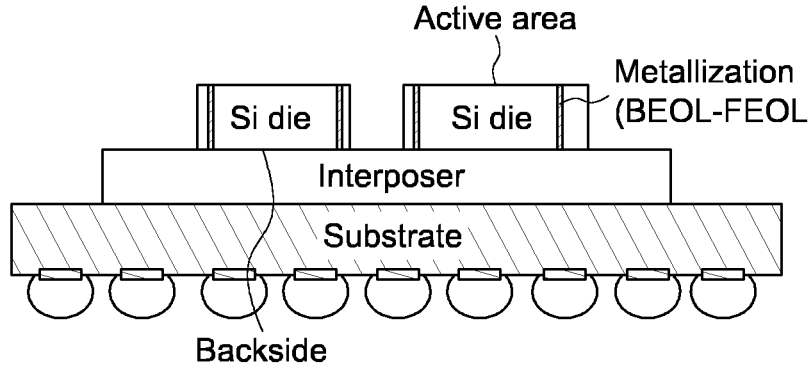
Figure 11L:
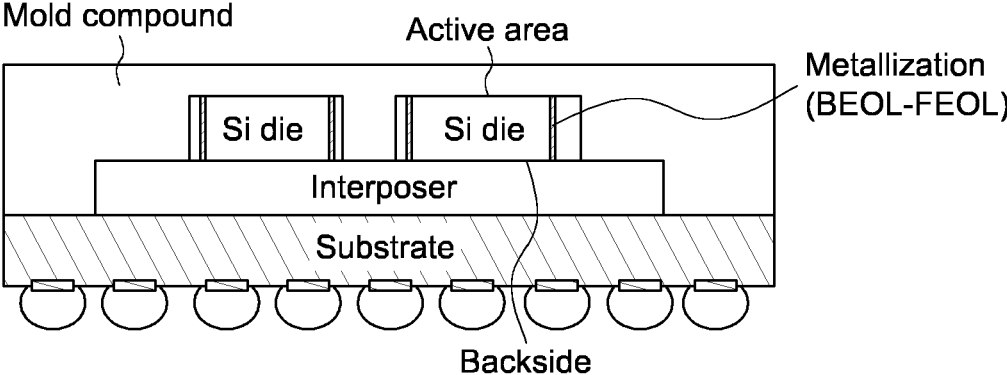
Figure 11M:
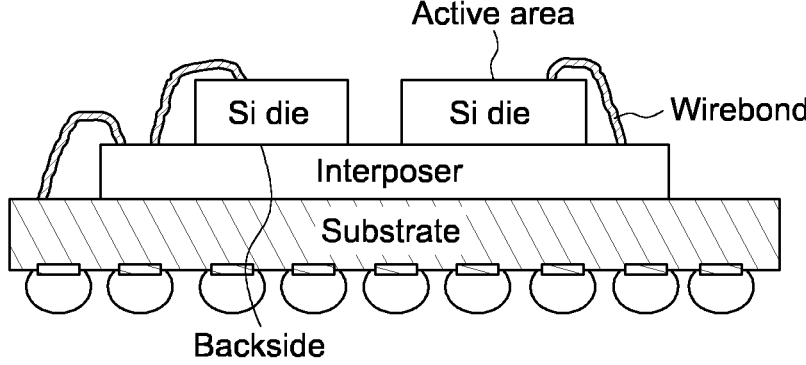
Figure 11N:
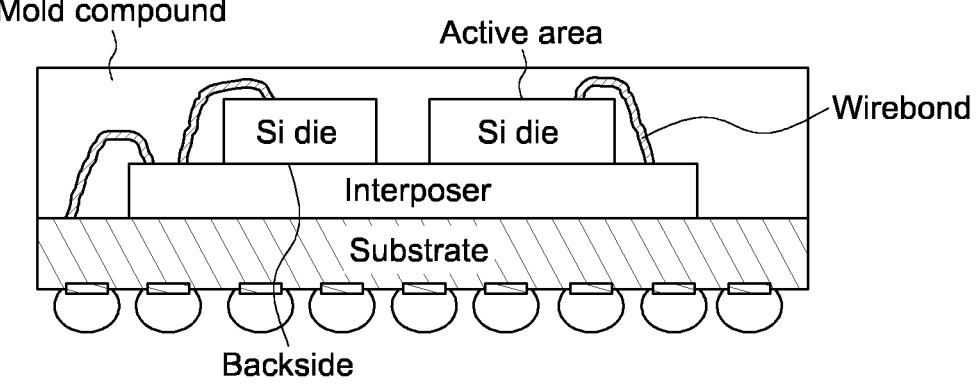
Figure 11O:
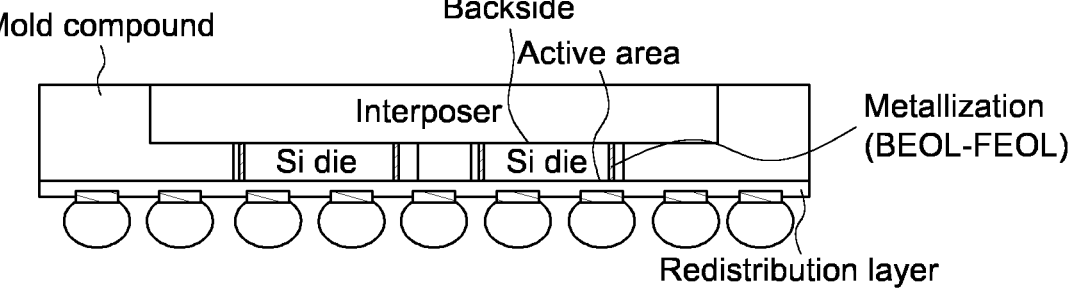
Figure 11O:
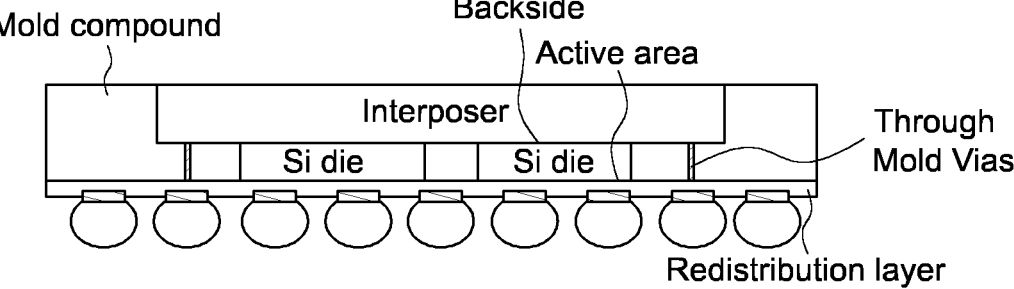
Figure 11P:
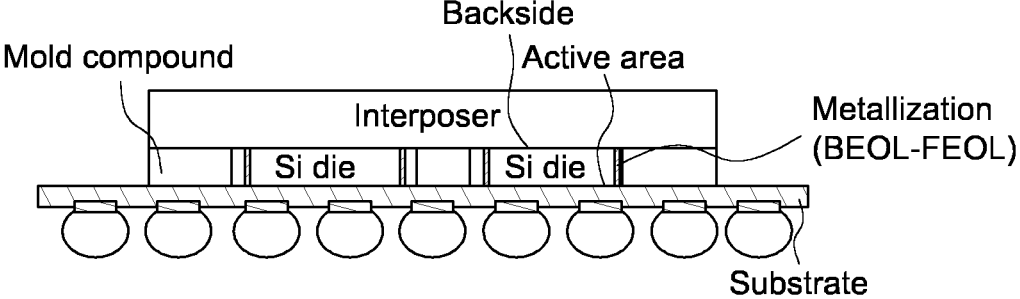
Figure 11P:
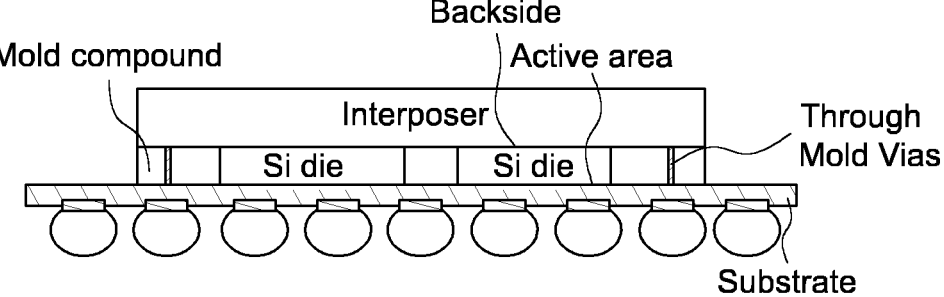
Figure 11Q:
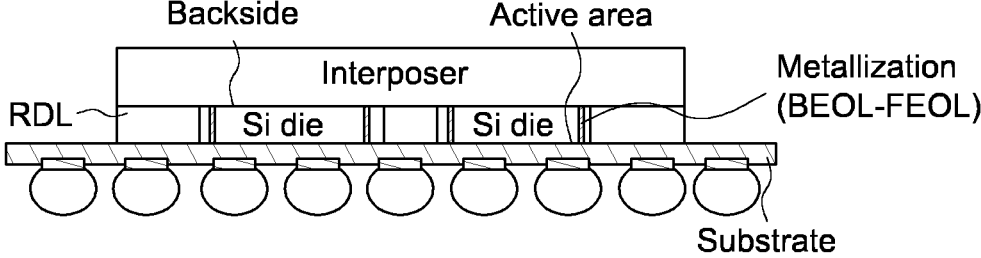
Figure 11Q:
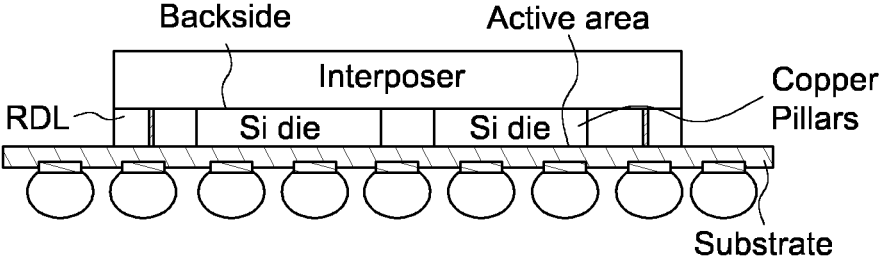
Figure 11R:
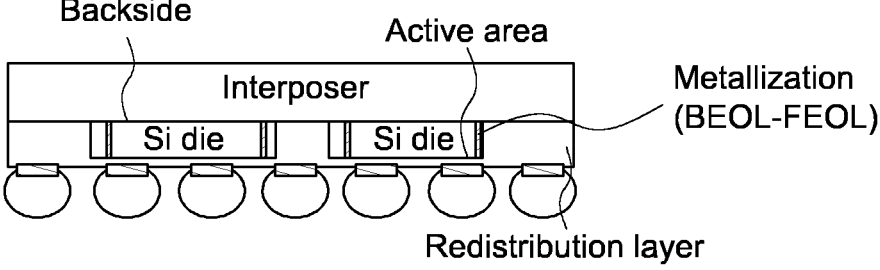
Figure 11R:
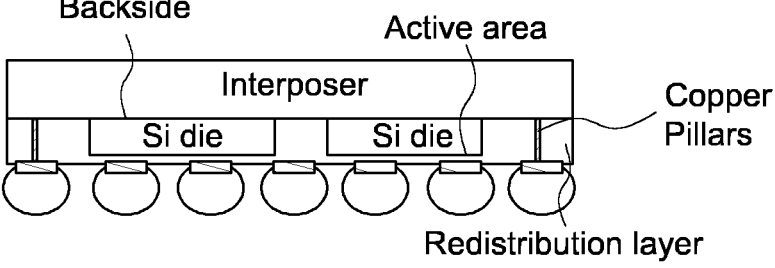
Figure 11S:
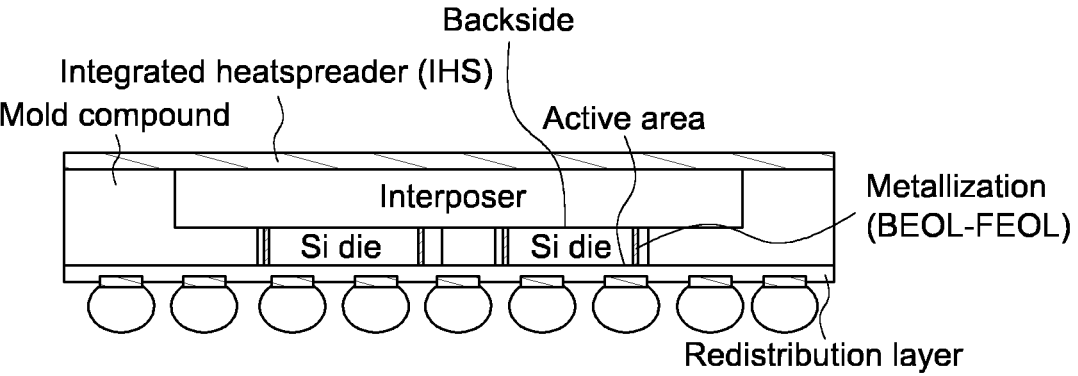
Figure 11S:
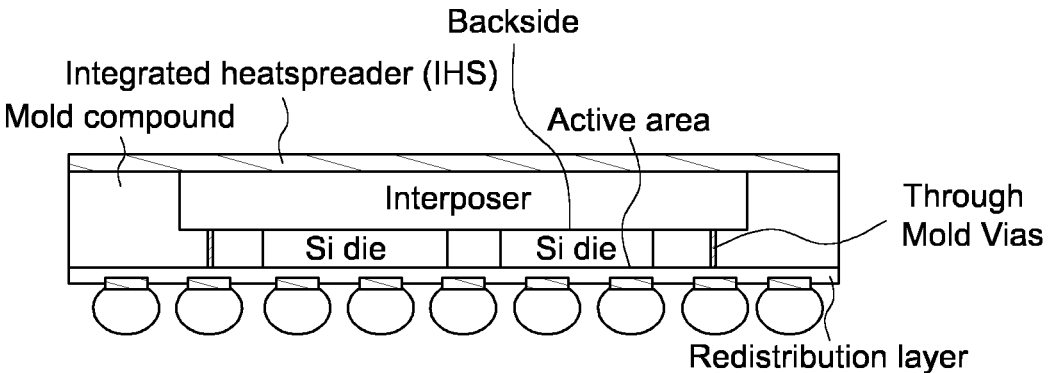
Figure 11T:
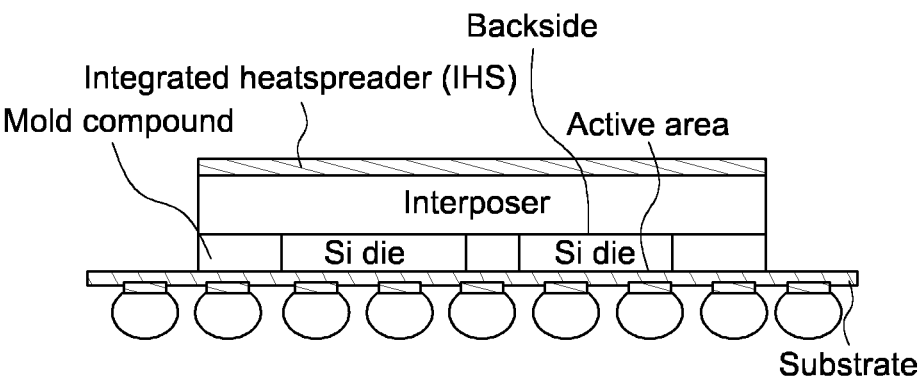
Figure 11U:
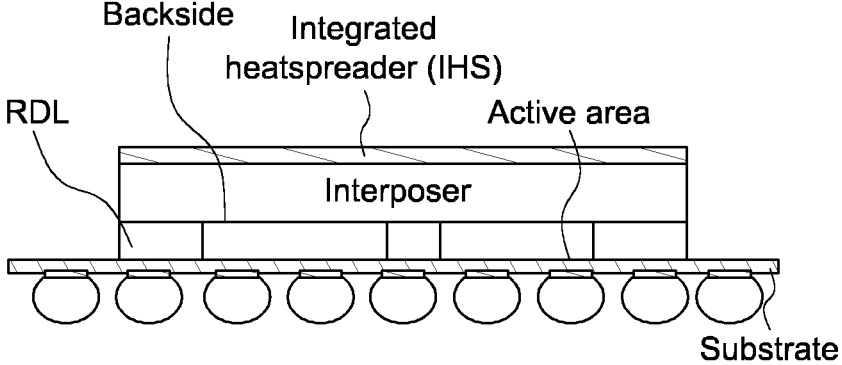
Figure 11V:
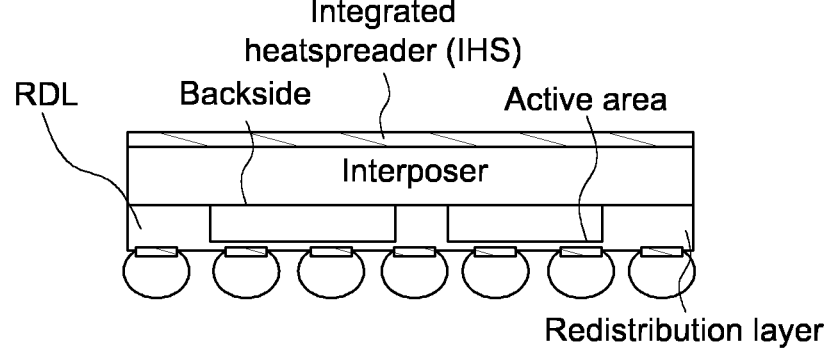
Figure 11T:
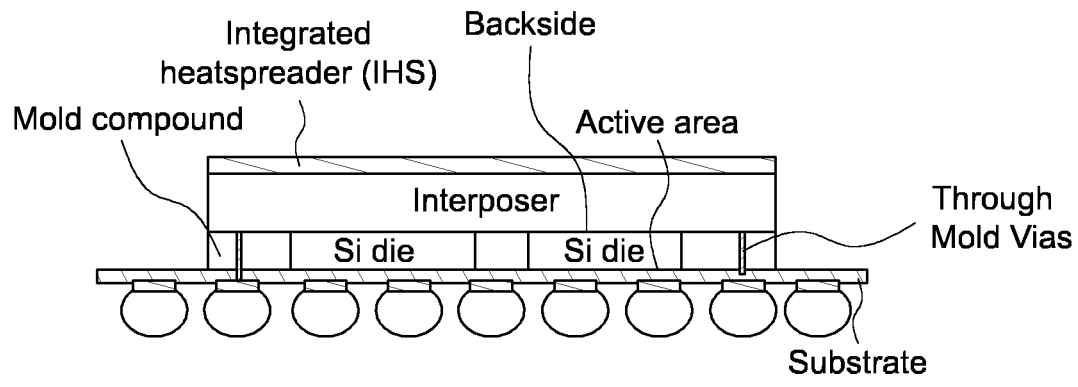
Figure 11U:
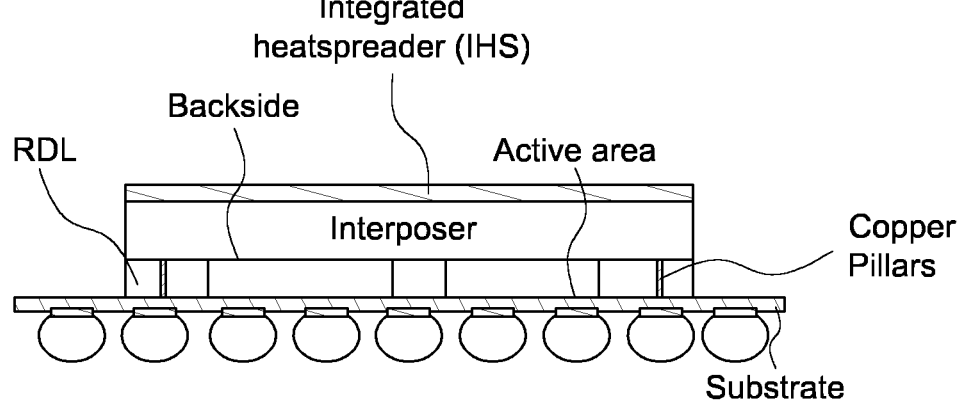
Figure 11V:
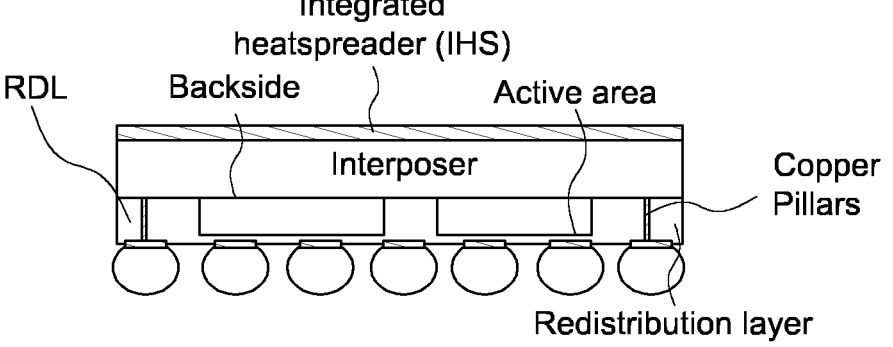

FIG. 8c shows an example in which the semiconductor device 800c may be assembled by semiconductor dies 210c, 211c, 212c, 213c each comprising a sub-circuitry. For example, a sub-circuitry may comprise an analog circuitry, a digital circuitry, a transistor, a memory chip, etc. Thus a semiconductor device 800c may be formed by connecting the sub-circuitries by the interposer 122.

FIG. 8d shows a top view of an arrangement of a semiconductor die 210 on an interposer 122. A cross section of the interposer 122 is larger than a cross section of the semiconductor device 210. FIG. 8e shows a top view and a side view along the path A-A' of a semiconductor device. A cross section of the interposer 122 is the same as a cross section of the semiconductor die 210.

More details and aspects are mentioned in connection with the examples described above and/or below. The example shown in FIG. 8 may comprise one or more optional additional features corresponding to one or more aspects mentioned in connection with the proposed concept or one or more examples described above (e.g., FIG. 2-7) and/or below (e.g., FIG. 9-13).

FIG. 9 shows an example of a method 900 for forming a semiconductor device. The semiconductor device can be the (first) semiconductor device as described with reference to FIGS. 2-8. The method 900 comprises forming 910 a plurality of transistors arranged at a front side of a semiconductor substrate of a semiconductor die. Further, the method 900 comprises forming 920 a first electrically conductive structure and a second electrically conductive structure each extending from the front side of the semiconductor substrate to a backside of the semiconductor substrate. The method 900 further comprises attaching 930 an interposer to the backside of the semiconductor substrate. The interposer comprises a first trace electrically connected to the first electrically conductive structure of the semiconductor die. Additionally, the first trace or a second trace is electrically connected to the second electrically conductive structure of the semiconductor die.

In an example, the first trace and the second trace may be connected, such that the first electrically conductive structure is connected with the second electrically conductive structure through the interposer. This way, both can be supplied, e.g., with the same power voltage.

More details and aspects are mentioned in connection with the examples described above and/or below. The example shown in FIG. 9 may comprise one or more optional additional features corresponding to one or more aspects mentioned in connection with the proposed concept or one or more examples described above (e.g., FIG. 2-8) and/or below (e.g., FIG. 10-13).

FIG. 10 shows another method 1000 for forming the semiconductor device. In an example, the first electrically conductive structure 140 and the second electrically conductive structure 142a may be buried under a surface of the semiconductor die 210 (see FIG. 10a). For example, the first 140 and the second electrically conductive structure 142a may be partially buried inside the semiconductor substrate 120, such that the first 140 and the second electrically conductive structure 142a may be buried under the backside of the semiconductor substrate 126. Thus, the first 140 and the second electrically conductive structure 142a can be easily connected from the front side of the semiconductor substrate 120, at which also the plurality of transistor is arranged, e.g. electrically connected to the plurality of transistors.

As can be seen in FIG. 10b, in an example the method 1000 may comprise exposing the buried first electrically conductive structure 140 and the second electrically conductive structure 142a, such that the interposer can be directly electrically connected to the buried first electrically conductive structure and the buried second electrically conductive structure.

To connect the interposer directly electrically with the semiconductor die 210 the interposer may be attached to a backside of the semiconductor die (see FIG. 10c). In an example, the interposer may be attached by DB, e.g., by hybrid bonding. The DB dielectric and the DB contact pads described above may be used for the hybrid bonding. A size of a bonding area may be at most 1000 mm$^2$ or 850 mm$^2$ or 500 mm$^2$ and/or 1 mm$^2$ or 50 mm$^2$ or 200 mm$^2$. A bonding alignment accuracy may be at most 2 μm or 1 μm or 0.5 μm. A topography may be at most 5 μm or 3 μm or 1 μm.

This way a semiconductor device 200 as can be seen in FIG. 10d can be formed.

More details and aspects are mentioned in connection with the examples described above and/or below. The example shown in FIG. 10 may comprise one or more optional additional features corresponding to one or more aspects mentioned in connection with the proposed concept or one or more examples described above (e.g., FIG. 2-9) and/or below (e.g., FIG. 11-13).

FIG. 11 shows cross-sectional views of different other examples of semiconductor devices. FIG. 11 shows further embodiments of semiconductor devices comprising a plurality of semiconductor dies. The semiconductor devices are designed for different packages, e.g., in a land grid array (FIGS. 11e-11j), in a flip chip (FIGS. 11k-11n, 11p-11q', 11t-11t', 11u, 11u'), in fan-out with respect to the interposer (see FIGS. 11o, 11o', 11s; 11s', 11v, 11v') and a fan-in with respect to the interposer (see FIGS. 11r, 11r'). An electrical signal may be transmitted from the package structure to the interposer depending on a package architecture, e.g. for a fan-in via RDL traces routed inwards or for a mold-component using through mold vias. The electrical signal may be transmitted from the front side of the interposer to a front side of the semiconductor device (an active side) e.g. by a TSV, a wire bond, etc. (not shown in every Fig.).

More details and aspects are mentioned in connection with the examples described above and/or below. The example shown in FIG. 11 may comprise one or more optional additional features corresponding to one or more aspects mentioned in connection with the proposed concept or one or more examples described above (e.g., FIG. 2-10) and/or below (e.g., FIG. 12-13).

Figures 12A, 12B, 12C, 12E:
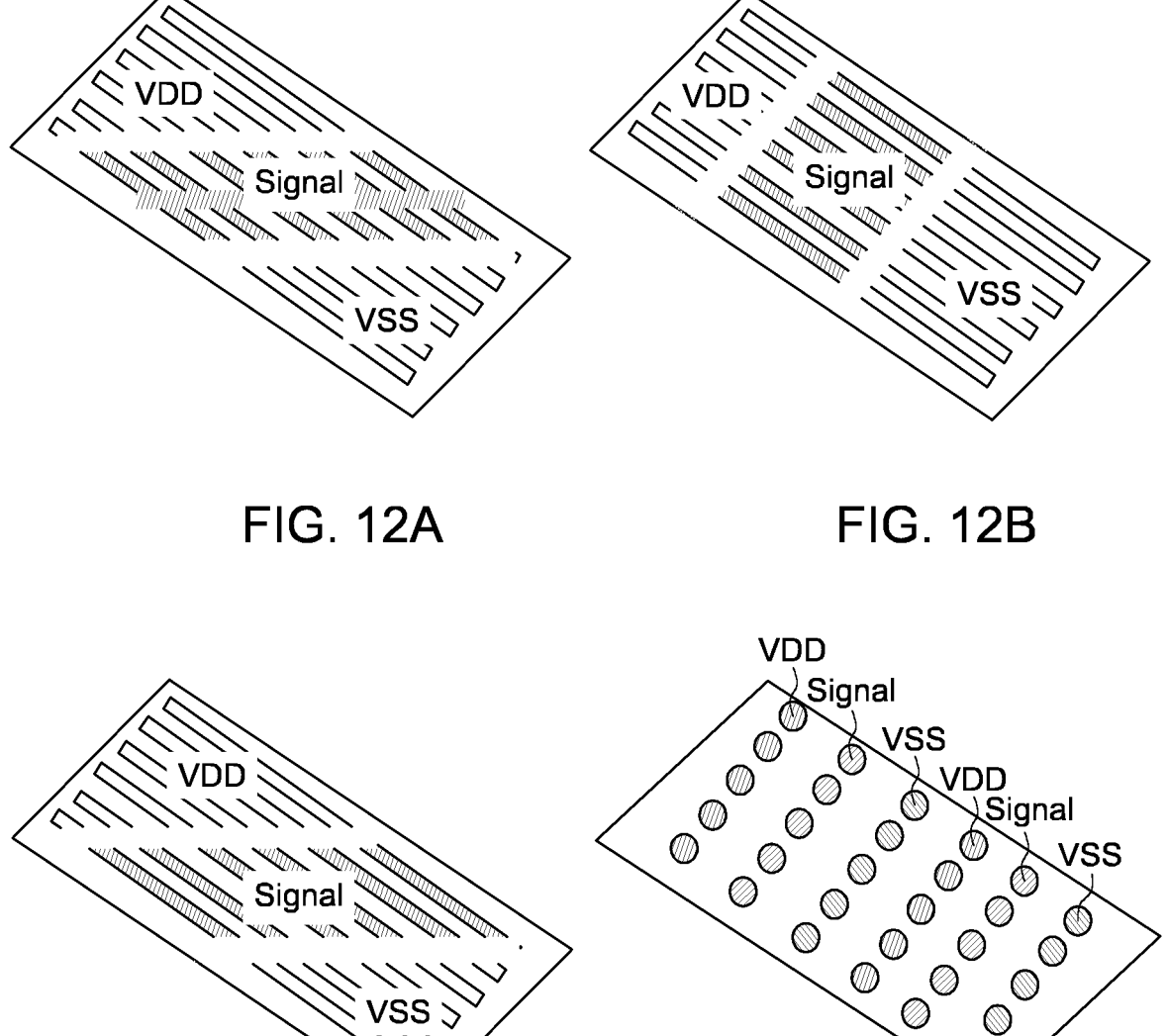
FIG. 12 shows different patterns of an interposer.

FIG. 12 shows different patterns of an interposer. The line width of the interposer may be at most 4 µm or 2 µm or 1 µm or 0.4 µm. The interposer may be an active or a passive interposer. The interposer may comprise multiple layers. The interposer may be a single side or a double side interposer.

More details and aspects are mentioned in connection with the examples described above and/or below. The example shown in FIG. 12 may comprise one or more optional additional features corresponding to one or more aspects mentioned in connection with the proposed concept or one or more examples described above (e.g., FIG. 2-11) and/or below (e.g., FIG. 13).

Figure 13:
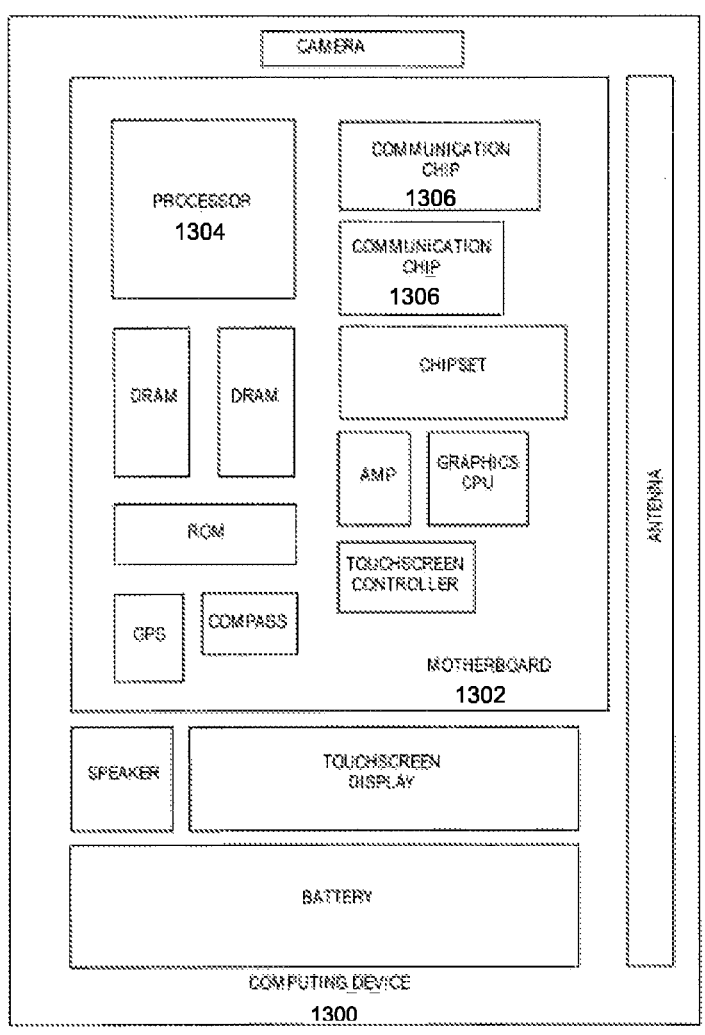
FIG. 13 illustrates a computing device in accordance with one implementation of the Invention.

FIG. 13 illustrates a computing device 1300 in accordance with one implementation of the invention. The computing device 1300 houses a board 1302. The board 1302 may include a number of components, including but not limited to a processor 1304 and at least one communication chip 706. A semiconductor device as described above may be the processor 1304 as shown in FIG. 13.

The processor 1304 is physically and electrically coupled to the board 1302. In some implementations the at least one communication chip 1306 is also physically and electrically coupled to the board 1302. In further implementations, the communication chip 1306 is part of the processor 1304.

Depending on its applications, computing device 1300 may include other components that may or may not be physically and electrically coupled to the board 1302. These other components include, but are not limited to, volatile memory (e.g., DRAM), non-volatile memory (e.g., ROM), flash memory, a graphics processor, a digital signal processor, a crypto processor, a chipset, an antenna, a display, a touchscreen display, a touchscreen controller, a battery, an audio codec, a video codec, a power amplifier, a global positioning system (GPS) device, a compass, an accelerometer, a gyroscope, a speaker, a camera, and a mass storage device (such as hard disk drive, compact disk (CD), digital versatile disk (DVD), and so forth). The communication chip 1306 enables wireless communications for the transfer of data to and from the computing device 1300. The term "wireless" and its derivatives may be used to describe circuits, devices, systems, methods, techniques, communications channels, etc., that may communicate data through the use of modulated electromagnetic radiation through a non-solid medium. The term does not imply that the associated devices do not contain any wires, although in some embodiments they might not. The communication chip 1306 may implement any of a number of wireless standards or protocols, including but not limited to Wi-Fi (IEEE 802.11 family), WiMAX (IEEE 802.16 family), IEEE 802.20, long term evolution (LTE), Ev-DO, HSPA+, HSDPA+, HSUPA+, EDGE, GSM, GPRS, CDMA, TDMA, DECT, Bluetooth, derivatives thereof, as well as any other wireless protocols that are designated as 3G, 4G, 5G, and beyond. The computing device 1300 may include a plurality of communication chips 1306. For instance, a first communication chip 1306 may be dedicated to shorter range wireless communications such as Wi-Fi and Bluetooth and a second communication chip 1306 may be dedicated to longer range wireless communications such as GPS, EDGE, GPRS, CDMA, WiMAX, LTE, Ev-DO, and others.

The processor 1304 of the computing device 1300 includes an integrated circuit die packaged within the processor 1304. In some implementations of the invention, the integrated circuit die of the processor includes one or more devices that are assembled in an ePLB or eWLB based P0P package that that includes a mold layer directly contacting a substrate, in accordance with implementations of the invention. The term "processor" may refer to any device or portion of a device that processes electronic data from registers and/or memory to transform that electronic data into other electronic data that may be stored in registers and/or memory.

The communication chip 1306 also includes an integrated circuit die packaged within the communication chip 1306. In accordance with another implementation of the invention, the integrated circuit die of the communication chip includes one or more devices that are assembled in an ePLB or eWLB based P0P package that that includes a mold layer directly contacting a substrate, in accordance with implementations of the invention.

More details and aspects are mentioned in connection with the examples described above. The example shown in FIG. 13 may comprise one or more optional additional features corresponding to one or more aspects mentioned in connection with the proposed concept or one or more examples described above (e.g., FIG. 2-12).

The aspects and features described in relation to a particular one of the previous examples may also be combined with one or more of the further examples to replace an identical or similar feature of that further example or to additionally introduce the features into the further example.

Examples may further be or relate to a (computer) program including a program code to execute one or more of the above methods when the program is executed on a computer, processor or other programmable hardware component. Thus, steps, operations or processes of different ones of the methods described above may also be executed by programmed computers, processors or other programmable hardware components. Examples may also cover program storage devices, such as digital data storage media, which are machine-, processor- or computer-readable and encode and/or contain machine-executable, processor-executable or computer-executable programs and instructions. Program storage devices may include or be digital storage devices, magnetic storage media such as magnetic disks and magnetic tapes, hard disk drives, or optically readable digital data storage media, for example. Other examples may also include computers, processors, control units, (field) programmable logic arrays ((F)PLAs), (field) programmable gate arrays ((F)PGAs), graphics processor units (GPU), application-specific integrated circuits (ASICs), integrated circuits (ICs) or system-on-a-chip (SoCs) systems programmed to execute the steps of the methods described above.

It is further understood that the disclosure of several steps, processes, operations or functions disclosed in the description or claims shall not be construed to imply that these operations are necessarily dependent on the order described, unless explicitly stated in the individual case or necessary for technical reasons. Therefore, the previous description does not limit the execution of several steps or functions to a certain order. Furthermore, in further examples, a single step, function, process or operation may include and/or be broken up into several sub-steps, -functions, -processes or -operations.

If some aspects have been described in relation to a device or system, these aspects should also be understood as a description of the corresponding method. For example, a block, device or functional aspect of the device or system may correspond to a feature, such as a method step, of the corresponding method. Accordingly, aspects described in relation to a method shall also be understood as a description of a corresponding block, a corresponding element, a property or a functional feature of a corresponding device or a corresponding system.

An example (e.g., example 1) relates to a semiconductor device, comprising a semiconductor die comprising a semiconductor substrate and a plurality of transistors arranged at a front side of the semiconductor substrate, wherein the semiconductor die comprises a first electrically conductive structure extending from the front side of the semiconductor substrate to a backside of the semiconductor substrate, wherein the semiconductor die comprises a second electrically conductive structure extending from the front side of the semiconductor substrate to the backside of the semiconductor substrate; and an interposer directly attached to the backside of the semiconductor substrate, wherein the interposer comprises a first trace electrically connected to the first electrically conductive structure of the semiconductor die and the first trace or a second trace electrically connected to the second electrically conductive structure of the semiconductor die.

Another example (e.g., example 2) relates to a previously described example (e.g., example 1) wherein the first electrically conductive structure is arranged vertically between a gate of a transistor of the plurality of transistors and the semiconductor substrate.

Another example (e.g., example 3) relates to a previously described example (e.g., one of the examples 1-2) wherein the first electrically conductive structure comprises an electrically conductive line connected to through substrate vias.

An example (e.g., example 4) relates to a semiconductor die comprising a semiconductor substrate and plurality of transistors arranged at a front side of the semiconductor substrate, wherein the semiconductor die comprises an electrically conductive line for providing an electrical signal for the plurality of transistors, wherein the electrically conductive line comprises a top surface at the front side of the semiconductor substrate and a bottom surface at the backside of the semiconductor substrate; and an interposer attached to the semiconductor die so that a trace of the interposer is electrically connected to the bottom surface of the electrically conductive line of the semiconductor die.

Another example (e.g., example 5) relates to a previously described example (e.g., one of the examples 1-4) wherein the semiconductor die has no through substrate via formed through the semiconductor substrate.

Another example (e.g., example 6) relates to a previously described example (e.g., one of the examples 1-5) wherein the plurality of transistors are fin field-effect transistors, a nanowire transistor, a ribbon transistor or a gate all around transistor.

Another example (e.g., example 7) relates to a previously described example (e.g., one of the examples 1-6) wherein the semiconductor substrate has no metallization on the backside.

Another example (e.g., example 8) relates to a previously described example (e.g., one of the examples 1-7) wherein the interposer has no contact on a backside.

Another example (e.g., example 9) relates to a previously described example (e.g., one of the examples 1-8) wherein the first trace and the second trace are electrically connected to the first electrically conductive structure and the second electrically conductive structure or the power supply by a direct copper to copper connection.

Another example (e.g., example 10) relates to a previously described example (e.g., one of the examples 1-9) wherein the interposer comprises a package contact interfaces for direct connection to a circuit board.

Another example (e.g., example 11) relates to a previously described example (e.g., one of the examples 1-10) wherein the front side of the semiconductor substrate is electrically connected to a front side of the interposer by a wire bond.

Another example (e.g., example 12) relates to a previously described example (e.g., one of the examples 1-11) further comprising a package structure being at least one of a substrate, a redistribution layer or a lead frame.

Another example (e.g., example 13) relates to a previously described example (e.g., the example 12) wherein the package structure is attached to a backside of the interposer.

Another example (e.g., example 14) relates to a previously described example (e.g., one of the examples 12 or 13) wherein the backside of the interposer is electrically connected to the package structure.

Another example (e.g., example 15) relates to a previously described example (e.g., one of the examples 12-14) wherein a front side of the interposer is electrically connected to the package structure by a wire bond.

Another example (e.g., example 16) relates to a previously described example (e.g., one of the examples 12-15) wherein the semiconductor die is arranged between the package structure and the interposer.

Another example (e.g., example 17) relates to a previously described example (e.g., one of the examples 1-16) wherein the semiconductor die is arranged between a ball grid array and the interposer.

Another example (e.g., example 18) relates to a previously described example (e.g., one of the examples 1-17) further comprising a heat spreading structure, wherein the heat spreading structure is attached to a backside of the interposer.

Another example (e.g., example 19) relates to a previously described example (e.g., one of the examples 1-18) further comprising an encapsulation embedding at least one of the interposer or the semiconductor die.

Another example (e.g., example 20) relates to a previously described example (e.g., the example 19) wherein the encapsulation further embeds the package structure.

Another example (e.g., example 21) relates to a previously described example (e.g., one of the examples 19 or 20) wherein the encapsulation is a mold compound.

Another example (e.g., example 22) relates to a previously described example (e.g., one of the examples 1-20) further comprising a redistribution layer.

Another example (e.g., example 23) relates to a previously described example (e.g., the example 22) wherein the redistribution layer is arranged at a front side of the interposer and embeds the semiconductor die.

Another example (e.g., example 24) relates to a previously described example (e.g., one of the examples 22 or 23) wherein a front side of the interposer is connected with the package structure via a copper pillar.

Another example (e.g., example 25) relates to a previously described example (e.g., one of the examples 1-24) further comprising a second semiconductor die comprising a semiconductor substrate and a plurality of transistors arranged at a front side of the semiconductor substrate, wherein the second semiconductor die comprises an electrically conductive structure; and wherein the interposer is directly attached with a front side to a backside of the second semiconductor substrate, wherein the interposer comprises a third trace electrically connected to the electrically conductive structure of the second semiconductor die.

Another example (e.g., example 26) relates to a previously described example (e.g., the example 25) wherein the front side of the interposer is electrically connected via microbumps with the backside of the second semiconductor.

Another example (e.g., example 27) relates to a previously described example (e.g., one of the examples 25 or 26) wherein the interposer connects the semiconductor die with the second semiconductor die.

Another example (e.g., example 28) relates to a previously described example (e.g., one of the examples 25-27) wherein a cross section of the first semiconductor die is different from a cross section of the second semiconductor die.

Another example (e.g., example 29) relates to a previously described example (e.g., one of the examples 25-28) wherein a backside of the semiconductor substrate is directly attached to a front side of the interposer.

Another example (e.g., example 30) relates to a previously described example (e.g., one of the examples 25-29) wherein the first semiconductor die is manufactured by a different technology node or circuit design as the second semiconductor die.

Another example (e.g., example 31) relates to a previously described example (e.g., one of the examples 25-30) wherein the first semiconductor die and the second semiconductor are sub-circuitries.

An example (e.g., example 32) relates to a method for forming a semiconductor device, comprising forming a plurality of transistors arranged at a front side of a semiconductor substrate of a semiconductor die, forming a first electrically conductive structure and a second electrically conductive structure each extending from the front side of the semiconductor substrate to a backside of the semiconductor substrate and attaching an interposer to the backside of the semiconductor substrate, wherein the interposer comprises a first trace electrically connected to the first electrically conductive structure of the semiconductor die and the first trace or a second trace electrically connected to the second electrically conductive structure of the semiconductor die.

Another example (e.g., example 33) relates to a previously described example (e.g., the example 32) wherein the first trace and the second trace are connected, such that the first electrically conductive structure is connected with the second electrically conductive structure through the interposer.

Another example (e.g., example 34) relates to a previously described example (e.g., one of the examples 31 or 33) wherein the interposer is attached by hybrid bonding.

Another example (e.g., example 35) relates to a previously described example (e.g., one of the examples 32-34) wherein the first electrically conductive structure and the second electrically conductive structure are buried under a surface of the semiconductor die; and further comprising exposing the buried first electrically conductive structure and the buried second electrically conductive structure, such that the interposer can be directly electrically connected to the buried first electrically conductive structure and the buried second electrically conductive structure.

Another example (e.g., example 36) relates to a previously described example (e.g., one of the examples 32-35) further comprising attaching a package structure to the interposer.

Another example (e.g., example 37) relates to a previously described example (e.g., one of the examples 32-36) further comprising forming an encapsulation embedding the interposer and the die.

Another example (e.g., example 38) relates to a previously described example (e.g., one of the examples 32-37) further comprising attaching a redistribution layer.

Another example (e.g., example 39) relates to a previously described example (e.g., one of the examples 32-38) further comprising attaching a heat spreading structure to the interposer.

Another example (e.g., example 40) relates to a previously described example (e.g., one of the examples 32-39) further comprising attaching the interposer with the front side to a backside of a second semiconductor substrate.

The following claims are hereby incorporated in the detailed description, wherein each claim may stand on its own as a separate example. It should also be noted that although in the claims a dependent claim refers to a particular combination with one or more other claims, other examples may also include a combination of the dependent claim with the subject matter of any other dependent or independent claim. Such combinations are hereby explicitly proposed, unless it is stated in the individual case that a particular combination is not intended. Furthermore, features of a claim should also be included for any other independent claim, even if that claim is not directly defined as dependent on that other independent claim.

What is claimed is:

1. A semiconductor device, comprising:
a semiconductor die comprising a semiconductor substrate and a plurality of transistors arranged on a front side of the semiconductor substrate, wherein the semiconductor die comprises a first electrically conductive structure extending from the front side of the semiconductor substrate to a backside of the semiconductor substrate and a second electrically conductive structure extending from the front side of the semiconductor substrate to the backside of the semiconductor substrate; and
an interposer directly attached to the backside of the semiconductor substrate, wherein the interposer comprises a first trace electrically connected to the first electrically conductive structure of the semiconductor die and the first trace or a second trace electrically connected to the second electrically conductive structure of the semiconductor die, the first trace and the second trace being coupled to a power source for supplying power to the plurality of transistors of the semiconductor die.

2. The semiconductor device according to claim 1, wherein the first electrically conductive structure is arranged vertically from a gate of a transistor of the plurality of transistors through the semiconductor substrate.

3. The semiconductor device according to claim 1, wherein the first electrically conductive structure comprises an electrically conductive line connected to through substrate vias.

4. The semiconductor device according to claim 1, wherein the semiconductor die has no through substrate via formed through the semiconductor substrate.

5. The semiconductor device according to claim 1, wherein the semiconductor substrate has no metallization on the backside of the semiconductor substrate.

6. The semiconductor device according to claim 1, wherein the interposer has no contact on a backside of the interposer.

7. The semiconductor device according to claim 1, wherein the first trace and the second trace are electrically connected to the first electrically conductive structure and the second electrically conductive structure, respectively, by a direct copper to copper connection.

8. The semiconductor device, according to claim 1, wherein the interposer comprises package contact interfaces for direct connection to a circuit board.

9. The semiconductor device according to claim 1, wherein the front side of the semiconductor substrate is electrically connected to a front side of the interposer by a wire bond.

10. The semiconductor device, according to claim 1, further comprising a package structure being at least one of a substrate, a redistribution layer or a lead frame.

11. The semiconductor device according to claim 10, wherein the package structure is attached to a backside of the interposer.

12. The semiconductor device according to claim 11, wherein the backside of the interposer is electrically connected to the package structure.

13. The semiconductor device according to claim 11, wherein a front side of the interposer is electrically connected to the package structure by a wire bond.

14. The semiconductor device according to claim 10, wherein the semiconductor die is arranged between the package structure and the interposer.

15. The semiconductor device according to claim 1, wherein the semiconductor die is arranged between a ball grid array and the interposer.

16. The semiconductor device according to claim 1, further comprising:

a heat spreading structure, wherein the heat spreading structure is attached to a backside of the interposer.

17. The semiconductor device according to claim 1, further comprising:

an encapsulation embedding at least one of the interposer or the semiconductor die.

18. The semiconductor device according to claim 17, wherein the encapsulation further embeds a package structure.

19. The semiconductor device according to claim 17, wherein the encapsulation is a mold compound.

20. The semiconductor device according to claim 1, further comprising:

a redistribution layer.

21. The semiconductor device according to claim 1, further comprising:

another semiconductor die comprising another semiconductor substrate and another plurality of transistors arranged on a front side of the another semiconductor substrate, wherein the another semiconductor die comprises an electrically conductive structure, wherein the interposer is attached to a backside of the another semiconductor substrate, wherein the interposer comprises a third trace electrically connected to the electrically conductive structure of the another semiconductor die.

22. The semiconductor device according to claim 21, wherein the front side of the interposer is electrically connected via microbumps to the backside of the another semiconductor die.

* * * * *